US012631788B2

(12) United States Patent
Lee et al.

(10) Patent No.: US 12,631,788 B2
(45) Date of Patent: May 19, 2026

(54) META-OPTICAL DEVICE AND METHOD OF MANUFACTURING METASURFACE

(71) Applicants: Samsung Electronics Co., Ltd., Suwon-si (KR); RESEARCH & BUSINESS FOUNDATION SUNGKYUNKWAN UNIVERSITY, Gyeonggi-do (KR)

(72) Inventors: Jeongyub Lee, Yongin-si (KR); Geunyoung Yeom, Seoul (KR); Heeju Kim, Suwon-si (KR); Jongwoo Hong, Suwon-si (KR); Yeonhee Kim, Seoul (KR); Kideok Bae, Yongin-si (KR); Haesoo Bae, Suwon-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 1027 days.

(21) Appl. No.: 17/724,861

(22) Filed: Apr. 20, 2022

(65) Prior Publication Data

US 2023/0094482 A1     Mar. 30, 2023

(30) Foreign Application Priority Data

Sep. 23, 2021     (KR) ........................ 10-2021-0125912

(51) Int. Cl.
*G02B 1/00*          (2006.01)
*G02B 5/18*          (2006.01)
*G03F 1/80*          (2012.01)
(52) U.S. Cl.
CPC ........... *G02B 1/002* (2013.01); *G02B 5/1809* (2013.01); *G03F 1/80* (2013.01); *G02B 2207/101* (2013.01)

(58) Field of Classification Search
CPC ..... Y10T 428/24479; Y10T 428/24612; Y10T 428/24942; Y10T 428/2495;
(Continued)

(56) References Cited

U.S. PATENT DOCUMENTS

| | | | |
|---|---|---|---|
| 4,574,177 A | 3/1986 | Wang | |
| 9,287,134 B2 | 3/2016 | Wang et al. | |

(Continued)

FOREIGN PATENT DOCUMENTS

| | | | | |
|---|---|---|---|---|
| JP | 5719579 B2 | 5/2015 | | |
| WO | WO-2017-091738 A1 | 6/2017 | | |
| WO | WO-2020097319 A1 * | 5/2020 | ....... | B29D 11/00788 |

OTHER PUBLICATIONS

Kim et al. "Etch characteristics of Si and TiO2 nanostructures using pulse biased inductively coupled plasmas", *Nanotechnology*, vo.31, No. 26, Apr. 9, 2020.
(Continued)

*Primary Examiner* — Maria V Ewald
*Assistant Examiner* — Ethan A. Utt
(74) *Attorney, Agent, or Firm* — Harness, Dickey & Pierce, P.L.C.

(57) ABSTRACT

A meta-optical device and a method of manufacturing a metasurface are provided. The meta-optical device includes a substrate and a nanostructure, wherein the nanostructure includes a first portion and a second portion that differ in at least one of a diameter and a period, wherein a ratio of an etch depth of the second portion to an etch depth of the first portion is about 0.9 to about 1.1, and the nanostructure includes at least one of sulfur, fluorine, and fluorocarbon.

17 Claims, 17 Drawing Sheets

(58) Field of Classification Search

CPC ..... Y10T 428/24967; Y10T 428/24975; Y10T 428/26; Y10T 428/261; Y10T 428/266; Y10T 428/31; Y10S 977/70; Y10S 977/755; Y10S 977/758; Y10S 977/762; Y10S 977/764; Y10S 977/778; Y10S 977/78; Y10S 977/781; Y10S 977/782; Y10S 977/811; Y10S 977/832; Y10S 977/834; Y10S 977/835; Y10S 977/902; Y10S 977/932; B32B 3/00; B32B 3/26; B32B 3/263; B32B 3/30; B32B 7/00; B32B 7/02; B32B 7/023; B32B 9/00; B32B 9/04; B32B 33/00; B32B 2307/40; B32B 2307/418; B32B 2307/71; B32B 2457/00; G02B 1/00; G02B 1/002; G02B 1/10; G02B 1/12; G02B 5/00; G02B 5/18; G02B 5/1809; G02B 5/1814; G02B 5/1819; G02B 5/1828; G02B 26/00; G02B 26/08; G02B 26/0808; G02B 27/00; G02B 27/09; G02B 27/0938; G02B 27/0944; G02B 27/42; G02B 27/44; G02B 2207/00; G02B 2207/101; G02F 1/00; G02F 1/29; G02F 1/292; G02F 2201/30; G02F 2201/305; G02F 2203/22; G02F 2203/24; B82B 1/00; B82B 1/005; B82B 1/008; B82Y 20/00; B82Y 30/00

USPC ....... 428/156, 172, 212, 213, 215, 216, 220, 428/332, 333, 337, 409, 426, 432, 446, 428/688, 689, 697, 698, 699, 701, 702, 428/704; 977/700, 755, 758, 762, 764, 977/778, 780, 781, 782, 811, 832, 834, 977/835, 902, 932; 359/558, 566, 569, 359/576

See application file for complete search history.

(56) References Cited

U.S. PATENT DOCUMENTS

| | | | |
|---|---|---|---|
| 2007/0290222 | A1 | 12/2007 | Huang |
| 2008/0088932 | A1 | 4/2008 | Cho et al. |
| 2013/0344290 | A1* | 12/2013 | Yu ........................ G02B 5/3025 977/932 |
| 2015/0251917 | A1* | 9/2015 | Hong .................. B81C 1/00031 216/24 |
| 2015/0334258 | A1* | 11/2015 | O'Neill .............. H04N 1/00307 348/207.1 |
| 2018/0192645 | A1* | 7/2018 | Nakahara ................ C08L 33/10 |
| 2019/0064532 | A1 | 2/2019 | Riley, Jr. et al. |
| 2020/0096833 | A1* | 3/2020 | Lee ...................... G02B 5/1866 |
| 2021/0088694 | A1 | 3/2021 | Lee et al. |

OTHER PUBLICATIONS

Arbabi et al. "Subwavelength-thick lenses with high numerical apertures and large efficiency based on high-contrast transmitarrays" *Nature Communications*, vol. 6 (2015).

Park et al. "All-Glass, Large Metalens at Visible Wavelength Using Deep-Ultraviolet Projection Lithography" Nano Letters, (2019) p. 8673-8682.

Arbabi et al. "Multiwavelength metasurfaces through spatial multiplexing" *Scientific Reports* vol. 6, (2016).

Zawawi et al. "Mechanical Performance of SiC based MEMS Capacitive Microphone for Ultrasonic Detection in Harsh Environment" *SPIE*, (2017).

Khorasaninejad et al. "Metalenses at visible wavelengths: Diffraction-limited focusing and subwavelength resolution imaging", Science (2016) p. 1190-1194.

European Search Report dated Oct. 25, 2022 for corresponding EP Patent Application No. 22169810.3.

* cited by examiner

| PREPARE SUBSTRATE INCLUDING PATTERN LAYER | — S101 |
| COVER CERTAIN PORTION OF PATTERN LAYER WITH ETCHING MASK | — S102 |
| ETCH PATTERN LAYER BY USING FLUORINE–BASED MIXED GAS AND FORM NANOSTRUCTURE | — S103 |

$$\frac{SF_6}{C_4F_8} > p_1$$

$$\frac{SF_6}{C_4F_8} = p_1$$

$$\frac{SF_6}{C_4F_8} < p_1$$

$$110 \begin{cases} 110A \\ 110B \end{cases}$$

$$111 \begin{cases} 111A \\ 111B \end{cases}$$

$$120 \begin{cases} 120A \\ 120B \end{cases}$$

$$121 \begin{cases} 121A \\ 121B \end{cases}$$

$$\frac{SF_6}{C_4F_8} > p_2$$

$$\frac{SF_6}{C_4F_8} = p_2$$

$$\frac{SF_6}{C_4F_8} < p_2$$

Binding Energy (eV)

2280

2320 FLASH

2310 LENS ASSEMBLY

2330 IMAGE SENSOR

2340 IMAGE STABILIZER

2350 MEMORY

2360 IMAGE SIGNAL PROCESSOR

2214

2410 OPTICAL DEVICE (BEAM DEFLECTOR / BEAM SHAPER)

2420 LIGHT SOURCE

2430 LIGHT DETECTOR

2440 SIGNAL PROCESSOR

2450 MEMORY

META-OPTICAL DEVICE AND METHOD OF MANUFACTURING METASURFACE

CROSS-REFERENCE TO RELATED APPLICATION

This application is based on and claims priority under 35 U.S.C. § 119 to Korean Patent Application No. 10-2021-0125912, filed on Sep. 23, 2021, in the Korean Intellectual Property Office, the disclosure of which is incorporated by reference herein in its entirety.

BACKGROUND

Some example embodiments relate to a meta-optical device, a method of manufacturing a metasurface, and/or an optical device including the metasurface.

Recently, in order to manufacture an optical device that overcomes or at least partially overcomes the physical limitations regarding diffraction, a device including a meta-surface having an insulating structure of a size smaller than the wavelength of light has been manufactured. To fabricate metasurface devices, it is required or desired to use a material having a high refractive index and a low absorption rate at a corresponding light wavelength. A metasurface has been prepared mainly using silicon (Si) having a refractive index of about 3.5 or more and an extinction coefficient of about 10-5 or less in an infrared wavelength band of about 1550 nm. However, because Si has a large light absorption (or a large extinction coefficient) in a visible ray region, which has a shorter wavelength than infrared rays, the transmission efficiency is greatly reduced, and thus, it may be difficult to apply Si to an optical device in the visible ray region.

A silicon dioxide ($SiO_2$) substrate may be used as a material to manufacture a metasurface in the visible ray region; however, $SiO_2$ has a relatively low refractive index of about 1.45 in the visible ray region. In order to increase a difference in a transmission phase shift passing through nanopatterns on the metasurface, a nanostructure having a large aspect ratio has to be formed. However, the lower the refractive index of a material, the greater a required or desired aspect ratio. In the case of $SiO_2$ having a refractive index of about 1.45, there is a disadvantage in that a high aspect ratio structure having a height of about 2 μm or more is required.

Alternatively or additionally, when a metasurface is manufactured, a phenomenon in which an etch depth varies with an etch area, that is, an aspect ratio dependent etch (ARDE), may occur, and thus, a method for eliminating such a phenomenon is required.

SUMMARY

Provided are meta-optical devices each having a nano-structure in which an etch depth is substantially uniform regardless of an etch area and/or a difference in an etch depth according to an etch area is small.

Alternatively or additionally, provided are methods of manufacturing a metasurface, the methods using a fluorine-based mixed gas to form a nanostructure in which an etch depth is substantially uniform regardless of an etch area and/or a difference in an etch depth according to an etch area is relatively small.

Alternatively or additionally, provided are methods of manufacturing a metasurface, the methods forming a nano-structure which includes an etch stop layer between a substrate and a pattern layer and in which an etch depth of the nanostructure is substantially uniform and/or an etch depth difference is relatively small.

Additional aspects will be set forth in part in the description which follows and, in part, will be apparent from the description, and/or may be learned by practice of one or more of the various example embodiments of the disclosure.

According to some example embodiments, a meta-optical device includes a substrate, and a nanostructure at least one of including a pillar array or defining a hole array arranged on the substrate. The nanostructure includes a first portion in which a plurality of first pillars having a first diameter neighboring at a first period or pitch are arranged, and a second portion which is different from the first portion in at least one of a diameter and a period, the second portion being a portion in which a plurality of second pillars having a second diameter and neighboring in a second period or pitch are arranged. A ratio of an etch depth of the second portion to an etch depth of the first portion is about 0.9 to about 1.1, and at least one of sulfur(S), fluorine (F), and fluorocarbon ($CF_x$) is at least one of on a surface of or inside the nanostructure.

At least one of an S content of one cross-section on at least one of the surface of or inside the nanostructure may be about 0.1 at % to about 5 at %, an F content of one cross-section located on at least one of the surface of or inside the nanostructure is about 1 at % to about 50 at %, or a $CF_x$ content of one cross-section located on at least one of the surface of or inside the nanostructure is about 1 at % to about 50 at %.

The meta-optical device may have a thickness of about 1 mm or less.

A period or pitch of the nanostructure may be about 150 nm to about 500 nm, a width of a cross-section of one of the plurality of first and second pillars in the nanostructure may be about 50 nm to about 350 nm, a height of one of the plurality of first and second pillars in the nanostructure may be about 200 nm to about 2000 nm, and an aspect ratio of one of the plurality of first and second pillars in the nano-structure may be about 1:5 or more.

The nanostructure may include a material having a refrac-tive index of about 2 or more and an extinction coefficient of about $1 \times 10^{-5}$ or less in a visible ray region. The nano-structure may include $TiO_2$.

The meta-optical device may further include a first etch stop layer between the substrate and the nanostructure. An etch rate of the first etch stop layer by a fluorine-based mixed gas including sulfur hexafluoride ($SF_6$) and octafluorocy-clobutene ($C_4H_8$) may be less than ⅕ times an etch rate of a material included in the nanostructure.

An extinction coefficient of the first etch stop layer in a visible ray region may be about $1 \times 10^{-5}$ or less.

A refractive index of the first etch stop layer may have a value between a refractive index of a material arranged on the first etch stop layer and a refractive index of a material arranged under the first etch stop layer, and the first etch stop layer may have a thickness configured to reduce or capable of reducing light reflection in the visible ray region, which occurs in a metasurface.

The first etch stop layer may have a thickness of about 10 nm to about 120 nm, and the first etch stop layer may include at least one of $Al_2O_3$, $HfO_2$, SiON, AlON, $Y_2O_3$, $Si_3N_4$, ZnO, $Ta_2O_5$, $ZrO_2$, AlN, and $Nb_2O_5$.

The meta-optical device may further include a second material, which is different from a material of the first etch stop layer, the second material between the first etch stop layer and the nanostructure.

According some example embodiments, an electronic device includes the meta-optical device described above.

According to some example embodiments, a method of manufacturing a metasurface includes preparing a substrate including a pattern layer, covering a certain portion of the pattern layer with an etching mask, and forming a nanostructure by etching the pattern layer using a fluorine-based mixed gas including a first gas for inducing etching of the pattern layer and a second gas for slowing an etch rate of the pattern layer.

The first gas may include sulfur hexafluoride ($SF_6$), the second gas may include octafluorocyclobutene ($C_4F_8$), the second gas may induce at least one of passivation or polymer formation in the pattern layer, and the etching may include at least one of inductively coupled plasma (ICP) etching and capacitively coupled plasma (CCP) etching of a plasma dry etching method.

In the forming, at least one of sulfur(S), fluorine (F), or fluorocarbon ($CF_x$) may be arranged on a surface of the nanostructure or injected into the nanostructure.

The nanostructure may include a pillar array including a plurality of pillars, or may define a hole array. A period or pitch of the nanostructure, e.g. a period or pitch along a first direction, may be about 150 nm to about 500 nm, a width of a cross-section of one of the plurality of pillars in the nanostructure, e.g. a width in the first direction, may be about 50 nm to about 350 nm, a height of one of the plurality of pillars in the nanostructure, e.g. a height in a vertical direction perpendicular to the first direction, may be about 200 nm to about 2000 nm, and an aspect ratio of one of the plurality of pillars in the nanostructure may be about 1:5 or more.

The pillar array may include a first portion in which a plurality of first pillars having a first diameter and having neighbors at a first period or pitch are arranged, and a second portion which is different from the first portion in at least one of a diameter and a period or pitch, and in which a plurality of second pillars having a second diameter and neighboring at a second period or pitch are arranged. A mixing ratio of the first gas to the second gas may be a ratio such that a ratio of an etch depth of the second portion to an etch depth of the first portion is about 0.9 to about 1.1.

The mixing ratio of the first gas to the second gas may be determined based on at least one of a diameter of a plurality of pillars formed in the first portion, a second period or pitch of the plurality of pillars formed in the first portion, an aspect ratio of the plurality of pillars formed in the first portion, a second diameter of a plurality of pillars formed in the second portion, a second period or pitch of the plurality of pillars formed in the second portion, and a second aspect ratio of the plurality of pillars formed in the second portion.

The mixing ratio of the first gas to the second gas may be a ratio such that a sidewall of at least one of the plurality of first and second pillars is substantially perpendicular to the substrate.

The pattern layer may include $TiO_2$.

The substrate including the pattern layer may further include a first etch stop layer between the substrate and the pattern layer, the first etch stop layer having a thickness configured to reduce light reflection in a visible ray region, wherein, in the forming, the first etch stop layer may not be etched or may be partially etched.

According to some example embodiments, a meta-optical device may comprise a substrate, and a nanostructure, the nanostructure including a diffraction grating, the diffraction grating array arranged on the substrate. The nanostructure includes a first portion and a second portion, a plurality of first lines having a first width along a first direction and neighboring at a first pitch along the first direction are arranged in the first portion, a plurality of second lines having a second width along the first direction neighboring at a second pitch along the first direction are arranged in the second portion, the second portion is different from the first portion in at least one of a width and a pitch, and a ratio of an etch depth of the second portion to an etch depth of the first portion is about 0.9 to about 1.1, and at least one of sulfur(S), fluorine (F), and fluorocarbon ($CF_x$) is at least one of on a surface of or inside the nanostructure.

At least one of a content of S in at least one of a cross-section of the surface of or inside the nanostructure may be about 0.1 at % to about 5 at % in both the first region and the second region, a content of F in the at least one of the cross-section of the surface of or the inside the nanostructure may be about 1 at % to about 50 at % in both the first region and the second region, or a content of $CF_x$ in the at least one of the cross-section of the surface of or the inside the nanostructure may be about 1 at % to about 50 at % in both the first region and the second region.

A width of a cross-section of one of the plurality of first and second lines in the nanostructure may be about 50 nm to about 350 nm, a height of the one of the plurality of first and second line in the nanostructure may be about 200 nm to about 2000 nm, and an aspect ratio of the one of the plurality of first and second lines in the nanostructure may be about 1:5 or more.

The meta-optical device may further comprise a first etch stop layer between the substrate and the nanostructure. An etch rate of the first etch stop layer with respect to etching with a fluorine-based mixed gas including sulfur hexafluoride ($SF_6$) and octafluorocyclobutene ($C_4H_8$) is less than ⅕ times an etch rate of a material included in the nanostructure.

An electronic device may include the meta-optical device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
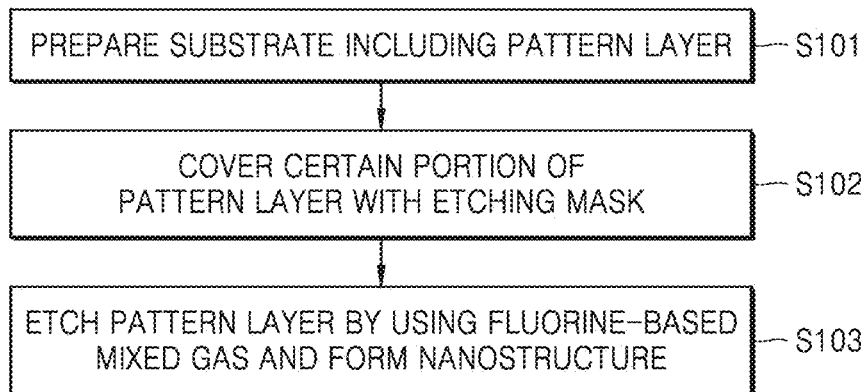
FIG. 1 is a flowchart illustrating a method of manufacturing a metasurface, according to some example embodiments.

Reference will now be made in detail to various embodiments, examples of which are illustrated in the accompanying drawings, wherein like reference numerals refer to like elements throughout. In this regard, the present embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. Various embodiments described herein are merely examples, and various modifications may be made from these example embodiments. In the following drawings, like reference numerals refer to like components, and the size of each component in the drawings may be exaggerated for clarity and convenience of description.

Hereinafter, when it is described that a certain component is "above" or "on" another component, the certain component may be directly above another component, or a third component may be interposed therebetween. Likewise, when it is described that a certain component is "under" or "below" another component, the certain component may be directly under another component, or a third component may be interposed therebetween.

The singular expressions include plural expressions unless the context clearly dictates otherwise. When a part "includes" a component, it may indicate that the part does not exclude another component but may further include another component, unless otherwise stated.

The use of the terms "a" and "an" and "the" and similar referents may cover both the singular and the plural.

The meaning of "connection" may include a physical connection as well as an optical connection.

The use of any and all examples, or other such language (e.g., "such as") provided herein, is intended merely to better illustrate the inventive concept and does not pose a limitation on the scope of the inventive concept unless otherwise claimed.

Terms such as first, second, etc., may be used to describe various components, but the components should not be limited by these terms. The terms are used only for the purpose of distinguishing one component from another.

The height, depth, and thickness may be substantially the same or within an error range recognizable by those skilled in the art.

Descriptions of a metasurface manufacturing or fabrication method according to some example embodiments may correspond to descriptions of a meta-optical device according to some example embodiments.

The meta-optical device may be an optical device including a metasurface.

Figure 2:
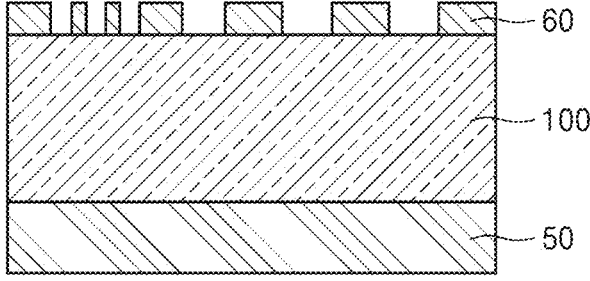
FIG. 2 is a cross-sectional view illustrating an etching mask on a pattern layer in a method of manufacturing a metasurface, according to some example embodiments.
Figure 3A:
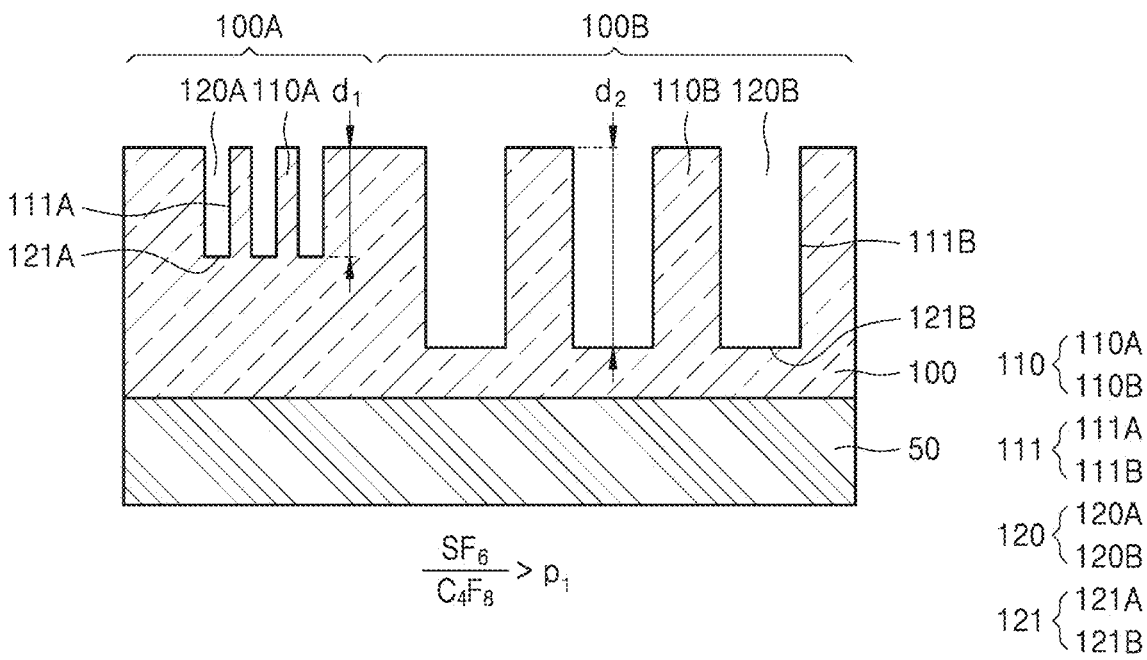
FIGS. 3A to 3C are cross-sectional views illustrating a nanostructure etched by varying the ratio of a fluorine mixed gas in a method of manufacturing a metasurface, according to some example embodiments.
Figure 3B:
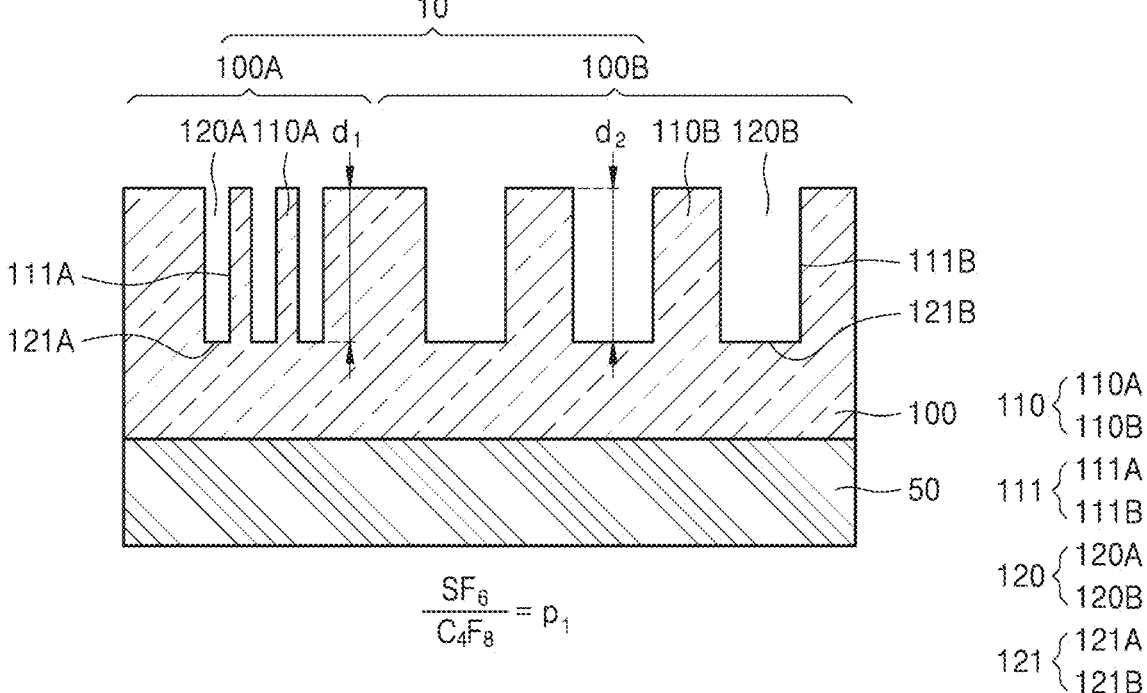
Figure 3C:
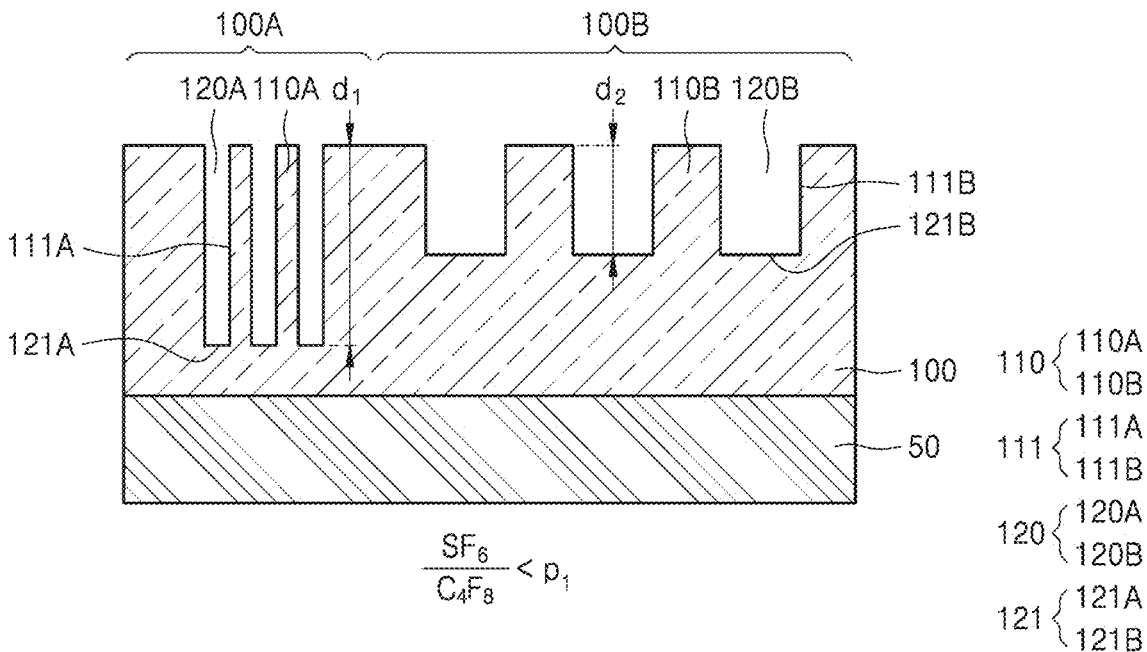
Figure 4A:
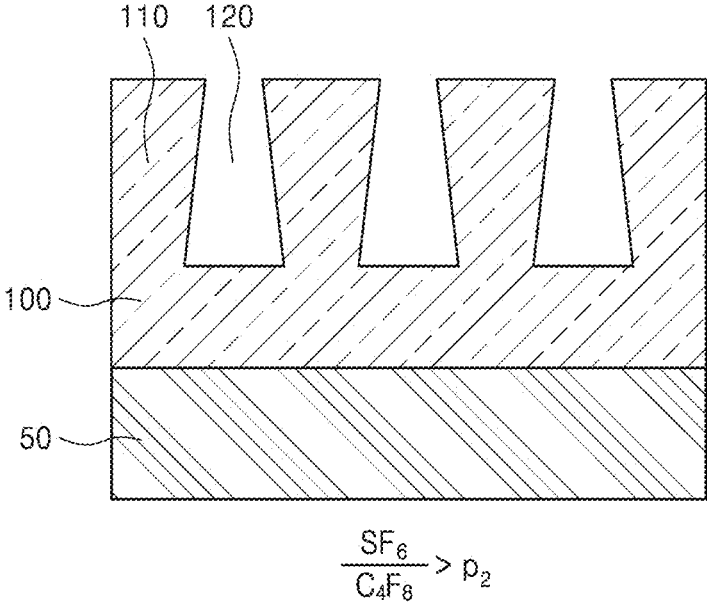
FIGS. 4A to 4C are cross-sectional views illustrating sidewall profiles of a nanostructure etched by varying the ratio of a fluorine mixed gas in a method of manufacturing a metasurface, according to some example embodiments.
Figure 4B:
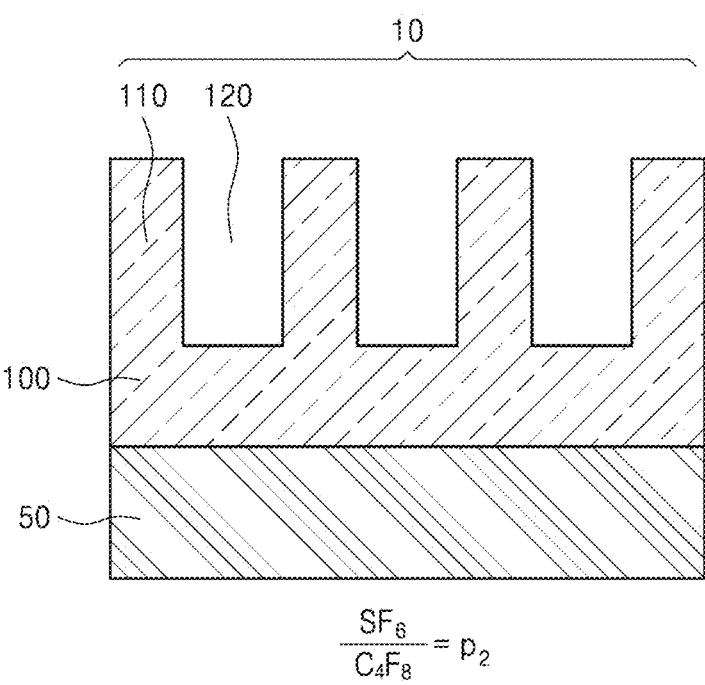
Figure 4C:
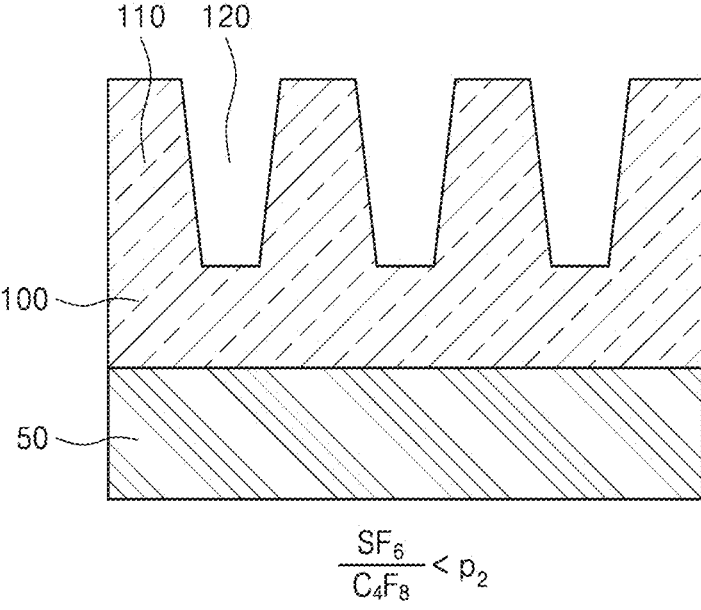
Figure 5A:
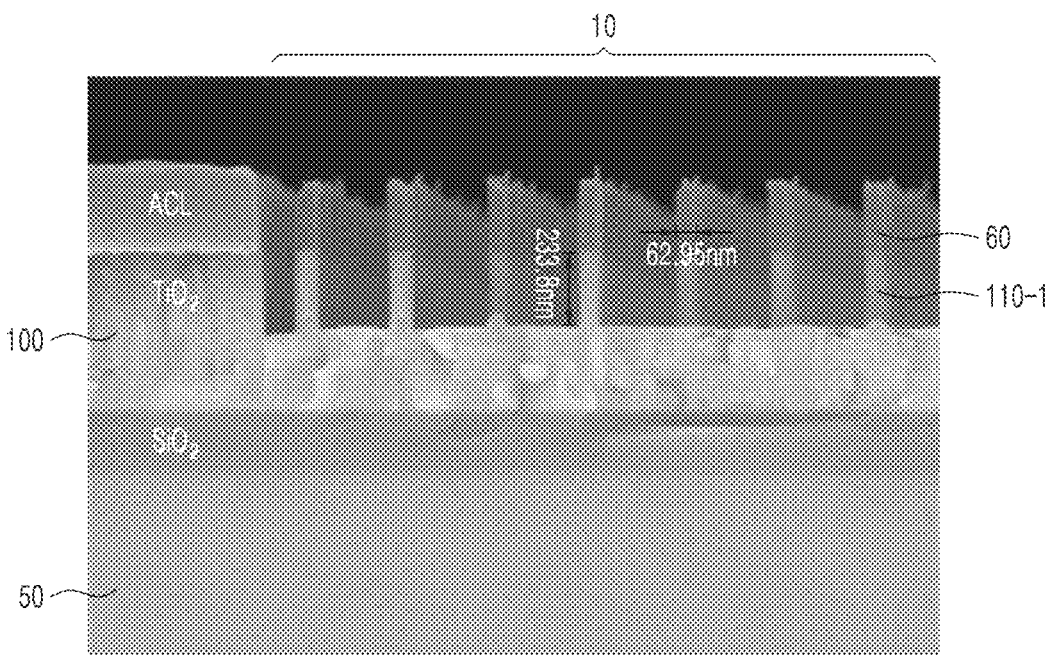
FIGS. 5A to 5C are photomicrographs of a meta-optical device including a nanostructure formed in a pattern layer by using a method of manufacturing a metasurface, according to some example embodiments.
Figure 5B:
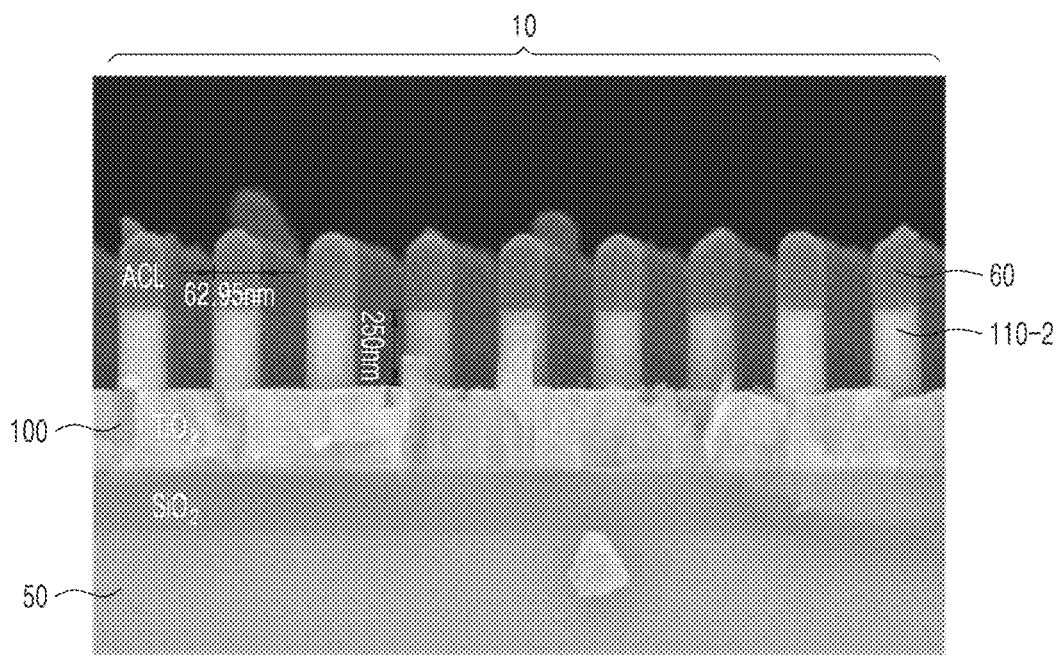
Figure 5C:
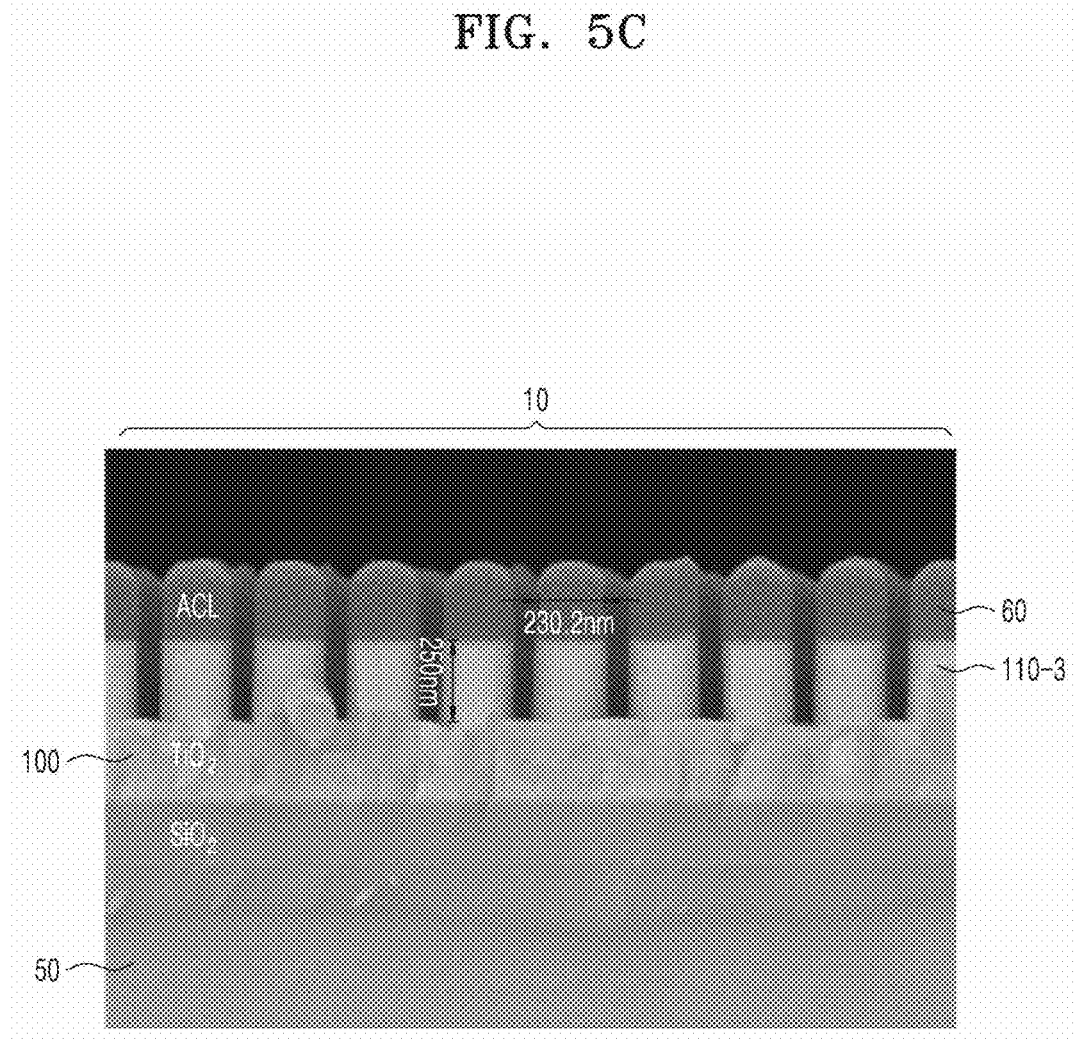

FIG. 1 is a flowchart illustrating a method of manufacturing a metasurface (hereinafter, referred to as a metasurface manufacturing method or metasurface fabrication method), according to some example embodiments, and FIG. 2 is a cross-sectional view illustrating an etching mask on a pattern layer in the metasurface manufacturing method according to some example embodiments. FIGS. 3A to 3C are cross-sectional views illustrating a nanostructure etched by varying the ratio of a fluorine mixed gas in the metasurface manufacturing method according to some example embodiments. FIGS. 4A to 4C are cross-sectional views illustrating sidewall profiles of a nanostructure etched by varying the ratio of a fluorine mixed gas in the metasurface manufacturing method according to some example embodiments. FIGS. 5A to 5C are photomicrographs (e.g., scanning electron micrographs) of a meta-optical device including a nanostructure formed in a pattern layer by using the metasurface manufacturing method according to some example embodiments.

The metasurface manufacturing method according to some example embodiments may include provisioning or preparing a substrate 50 on which a pattern layer 100 is arranged, covering a certain portion of the pattern layer 100 with an etching mask 60, and etching the pattern layer 100 by using a fluorine-based mixed gas G to form a nanostructure 10. The fluorine-based mixed gas G may include a first gas G1 that is capable of inducing etching of the pattern layer 100, and a second gas G2 that serves to slow the etch rate of the pattern layer 100. The nanostructure 10 formed by the above manufacturing method may include at least one of a pillar array including a plurality of pillars 110, or that defines a hole array including a plurality of holes, and may be used as a metasurface because the period or pitch of a nanopattern (e.g., the plurality of pillars 110 and the plurality of holes) of the nanostructure 10, the width of a cross-section thereof, etc. have sizes less than the wavelength of light incident on the nanostructure 10. The thickness of the metasurface ranges from about several tens of nanometers to about several thousand nanometers, and the metasurface is manufactured to be thin, and thus, a small-thickness optical device may be implemented.

According to FIGS. 1 and 2, the substrate 50 on which the pattern layer 100 is arranged is prepared or provisioned (S101). The substrate 50 may be or may include, for example, an oxide such as $SiO_2$, and/or another dielectric material. The pattern layer 100 may include a material having a refractive index of about 2 or more and an extinction coefficient of about $1\times10^{-5}$ or less in or within a visible ray region. For example, the pattern layer 100 may include titanium dioxide ($TiO_2$). $TiO_2$ may have a refractive index of about 2.4 or more in a visible ray region of about 380 nm to about 750 nm. Also, $TiO_2$ may have an extinction coefficient of about $1\times10^{-5}$ or less in the visible ray region. As the refractive index of a material included in the pattern layer 100 increases, the aspect ratio of the nanostructure 10 formed in the pattern layer 100 may decrease. In order to implement the metasurface structure, it may be necessary or desirable to increase a difference in the transmission phase shift of light passing through nanopatterns such as a pillar array. As the aspect ratio of a structure included in the nanopattern increases, the difference in the transmission phase shift may increase. As the refractive index of a material included in the pattern layer 100 increases, the aspect ratio may be relatively lower than when a material having a small refractive index is used. For example, $SiO_2$ with a refractive index of about 1.46 (for light having a wavelength of about 550 nm) may require or may use a nanostructure 10 having a high aspect ratio due to its relatively small refractive index. On the other hand, because $TiO_2$ has a refractive index of about 2.4 or more in the visible ray region, a metasurface structure may be implemented even with a relatively low aspect ratio compared to $SiO_2$.

Referring to FIGS. 1 and 2, a certain portion of the pattern layer 100 is covered with the etching mask 60 on the substrate 50 on which the pattern layer 100 is arranged (S102). When the etching mask 60 is covered on the pattern layer 100, etching may not occur in a portion covered with the etching mask 60. Accordingly, the nanostructure 10 in which a trench 120 and/or a hole is formed in a portion not covered with the etching mask 60 after etching may be formed. Etching may not occur in the portion covered with the etching mask 60, for example, pillars 110 such as disconnected pillars may be formed. The etching mask 60 may be arranged to correspond to the nanostructure 10 to be formed and cover a certain portion of the pattern layer 100. For example, an amorphous carbon layer (ACL) may be used as the etching mask 60. The etching mask 60 may be removed through a separate process after the formation of the nanostructure 10.

Referring to FIGS. 1 and 3A to 3C, the pattern layer 100 is etched using the fluorine-based mixed gas G to form the nanostructure 10 (S103). The formed nanostructure 10 may include a pillar array including a plurality of pillars 110, and/or may define a hole array including a plurality of holes. However, example embodiments are not limited thereto, and various shapes of nanopatterns may be formed in the nanostructure 10.

In the nanostructure 10 formed according to the metasurface manufacturing method according to some example embodiments, pillars 110 having the same aspect ratio may be formed in the same period or having the same pitch and distance between neighboring pillars. In addition, pillars 110 having the same aspect ratio may be formed in different periods or different pitches, and pillars 110 having different aspect ratios may be formed in the same period or at the same pitch. In addition, pillars 110 having different aspect ratios may be formed in different periods or having different pitches.

The pillars 110 having different aspect ratios may each include a sidewall 11 of substantially the same height (or etch depth), or of a small difference in height (or etch depth). In the latter case, the small difference in the height of the sidewall 111 may mean that the pillars 110 are formed with a difference within about 10% of a relatively small one among the heights of the sidewalls 111. The trench 120 may be formed between the plurality of pillars 110, and may include a trench bottom surface 121. A first trench 120A may be formed between a plurality of first pillars 110A, and may include a first trench bottom surface 121A. Similarly, a second trench 120B may be formed between a plurality of second pillars 110B, and may include a second trench bottom surface 121B.

The period or pitch of the plurality of pillars 110 of the nanostructure 10 formed according to the metasurface manufacturing method according to various example embodiments may be less than the wavelength of incident light. For example, when the incident light is in a visible wavelength range, the period of the plurality of pillars 110 may be about 150 nm to about 500 nm. Alternatively or additionally, the cross-sectional width of one pillar among the plurality of pillars 110 of the nanostructure 10 may be less than the wavelength of light. For example, when the incident light is in the visible ray wavelength range, the cross-sectional width of one pillar among the plurality of pillars 110 may be about 50 nm to about 350 nm. The height of one pillar among the plurality of pillars 110 may be about 200 nm to about 2000 nm.

The nanostructure 10 formed according to the metasurface manufacturing method according to some example embodiments may include a structure having an aspect ratio of 1:5 or more. As the aspect ratio increases, a transmission phase shift generated when light passes through the metasurface may increase. When the nanostructure 10 includes the pillar array, the aspect ratio of the pillars 110 may be 1:5 or more. When the nanostructure 10 includes the hole array, the aspect ratio of the holes may be 1:5 or more.

The pillar array in the nanostructure 10 may include a first portion 100A in which a plurality of first pillars 110A having a first diameter and a first period are arranged, and a second portion 100B, which is different from the first portion in at least one of the diameter or the period of the pillar 110 and in which a plurality of second pillars 110B having a second diameter and a second period are arranged. For example, the first period and the second period may be the same and the first diameter and the second diameter may be different from each other, or the first diameter and the second diameter may be the same and the first period and the second period may be different from each other. Alternatively, the first diameter and the second diameter may be different from each other and the first period and the second period may be different from each other. For example, the second period may be greater than or less than the first period. The first and second periods or first and second pitches may be measured along a first direction that is parallel to a surface of the substrate 50.

The fluorine-based mixed gas G used in the metasurface manufacturing method according to some example embodiments may include a plurality of gases. The fluorine-based mixed gas G may include a first gas G1 and a second gas G2. The first gas G1 may induce etching of the pattern layer 100, and the second gas G2 may slow the etch rate of the pattern layer 100. The second gas G2 may slow the etch rate by forming one or more of a passivation or polymer on the pattern layer 100. The first gas G1 and the second gas G2 may have complementary roles. For example, sulfur hexafluoride ($SF_6$) may be used as the first gas G1, and octafluorocyclobutane ($C_4F_8$) may be used as the second gas G2. An argon (Ar) gas may be used together with the fluorine-based mixed gas G during etching.

When only the first gas G1 for inducing etching is used to form the nanostructures 10, an aspect ratio dependent etch (ARDE) effect in which an etch depth is different for different etch areas may appear. This may be because the etch rate is slowed because it is difficult to introduce an etching gas into a pattern having a high aspect ratio and/or a narrow pattern due to reactive ion etching lag (RIE lag) occurring due to plasma etching. This may be or may be referred to a loading effect or a micro-loading effect. For example, the etch depth may be further reduced as the etch area becomes narrower, and the etch depth may increase as the etch area increases. When forming the nanostructure 10, which has different linewidths and/or different diameters and/or different pitches and/or different etch areas, on the pattern layer 100, if the ARDE effect may not be reduced, it may be difficult to form the nanostructure 10 having a substantially uniform etch depth.

When the fluorine-based mixed gas G is used in the metasurface manufacturing method according to some example embodiments, the fluorine-based mixed gas G may include the first gas G1 that induces etching, and the second gas G2 that induces the formation of polymer and slows the etch rate. The second gas G2 may reduce or cancel the ARDE effect caused by the first gas G1. Referring to FIGS. 3A to 3C, the second diameter of the second pillar 110B in the second portion 100B is greater than the first diameter of the first pillar 110A in the first portion 100A, and the second period of the second portion 100B is greater than the first period of the first portion 100A. When a mixed gas is formed at a ratio (e.g., a ratio of the first gas G1 to the second gas G2), which is greater than a certain mixing ratio $p_1$, to form the nanostructure 10, a first etch depth $d_1$ of the first portion 100A of the nanostructure 10 may be less than a second etch depth $d_2$ of the second portion 100B of the nanostructure 10 due to the ARDE effect, as shown in FIG. 3A. In this case, a difference between the first etch depth $d_1$ and the second etch depth $d_2$ in the presence of the second gas G2 may be smaller than a difference between the first etch depth $d_1$ and the second etch depth $d_2$ in the absence of the second gas G2. This may be because the ARDE effect is reduced by the second gas G2. When the mixed gas is formed at a ratio (e.g., a ratio of the first gas G1 to the second gas G2), which is equal to the certain mixing ratio $p_1$, to form the nanostructure 10, the ARDE effect caused by the first gas G1 may be substantially canceled by the second gas G2, and thus, the first etch depth $d_1$ and the second etch depth $d_2$ may be substantially equal to each other, or the first etch depth $d_1$ and the second etch depth $d_2$ may have a difference within about 10% of the smaller of the first etch depth $d_1$ and the second etch depth $d_2$, as shown in FIG. 3B. Alternatively, the ratio of the second etch depth $d_2$ to the first etch depth $d_1$ may be about 0.9 to about 1.1. When the mixed gas is formed in a ratio (i.e., a ratio of the first gas G1 to the second gas G2), which is less than the certain mixing ratio $p_1$ to form the nanostructure 10, an effect opposite to the ARDE effect may be obtained due to the second gas G2, and thus, the first etch depth $d_1$ may be greater than the second etch depth $d_2$ as shown in FIG. 3C. When the second gas G2 is mixed with the first gas G1 in a ratio greater than a certain ratio, an effect opposite to the ARDE effect may be exhibited, and thus, the larger a line width and/or the larger the etch area, the better the polymer formation may occur. By appropriately adjusting the ratio of the first gas G1 to the second gas G2, a difference between the etch depths in regions having different diameters and/or periods of the holes or the pillars 110 may be reduced or the etch depths may substantially be the same. The first etch depth $d_1$ of the first portion 100A may be the height of a first sidewall 111A of the first pillar 110A included in the first portion 100A, and the second etch depth $d_2$ of the second portion 100B may be the height of a second sidewall 111B of the second pillar 110B included in the second portion 100B.

When a fluorine mixed gas including the first gas G1 and the second gas G2 is formed at the certain mixing ratio $p_1$ and used to form the nanostructure 10, the first portion 100A of the pillar array and the second portion 100B thereof may be etched substantially uniformly, and/or the etch depth of the first portion 100A and the etch depth of the second portion 100B may have a difference within about 10% of the smaller of the etch depth of the first portion 100A and the etch depth of the second portion 100B. Alternatively or additionally, the mixing ratio of the first gas G1 to the second gas G2 may be in a ratio such that the ratio of the etch depth of the second portion 100B to the etch depth of the first portion 100A is about 0.9 to about 1.1. The certain mixing ratio $p_1$ of the first gas G1 to the second gas G2 may vary depending on the diameter of the first pillar 110A formed in the first portion 100A, the period of the first pillar 110A formed in the first portion 100A (the period of the first portion 100A), the diameter of the second pillar 110B formed in the second portion 100B, and the period of the second pillar 110B formed in the second portion 100B (the period of the second portion 100B). Alternatively or additionally, the certain mixing ratio $p_1$ is not limited to the conditions listed above, and may vary depending on the temperature during manufacturing processes, the aspect ratio of the first pillar 110A of the first portion 100A, the aspect ratio of the second pillar 110B of the second portion 100B, and the like. Accordingly, the certain mixing ratio $p_1$ of the first gas G1 to the second gas G2 may be determined based on the above conditions.

Referring to FIGS. 4A to 4C, the profile of sidewalls 111 of the plurality of pillars 110 formed according to the mixing ratio of the first gas G1 to the second gas G2 may be changed. The mixing ratio of the first gas G1 to the second gas G2 may be a ratio such that the sidewall 111 of at least one of the plurality of pillars 110 is substantially perpendicular to the substrate 50. When a mixed gas is formed at a ratio (e.g., a ratio of the first gas G1 to the second gas G2), which is greater than a certain mixing ratio $p_2$, to form the nanostructure 10, a plurality of pillars 110 each having a profile of the sidewall 111 of which the diameter increases as the distance from the substrate 50 increases may be formed, as shown in FIG. 4A. When the mixed gas is formed in a ratio (e.g., a ratio of the first gas G1 to the second gas G2), which is equal to the certain mixing ratio $p_2$ to form the nanostructure 10, a plurality of pillars 110 each having a profile of the sidewall 111 which has substantially the same diameter along the height thereof, e.g., is substantially vertical, may be formed as shown in FIG. 4B. When the mixed gas is formed at a ratio (e.g., a ratio of the first gas G1 to the second gas G2), which is less than the certain mixing ratio $p_2$, to form the nanostructure 10, a plurality of pillars 110 each having a profile of the sidewall 111 of which the diameter decreases as the distance from the substrate 50 increases may be formed, as shown in FIG. 4C. By appropriately adjusting the ratio of the first gas G1 to the second gas G2, the profile of the sidewall 111 of the nanostructure 10 may be varied and improved.

When a fluorine mixed gas including the first gas G1 and the second gas G2 is formed at the certain mixing ratio $p_2$ and used to form the nanostructure 10, the plurality of pillars 110 may each be formed to have a profile of the sidewall 111 that is substantially vertical. The substantially vertical profile of the sidewall 111 may be formed because etching by the first gas G1 and passivation and/or polymer formation by the second gas G2 occur at an appropriate ratio. In this case, the substantially vertical profile of the sidewall 111 may include not only the case in which each of the pillars 110 has the sidewall 111 at a 90 degree angle to the substrate 50 but also the case in which the profile of the sidewall 111 is substantially vertical within an acceptable error range. The certain mixing ratio $p_2$ of the first gas G1 to the second gas G2 for forming the substantially vertical profile of the sidewall 111 may be substantially the same as or have a slight difference from the certain mixing ratio $p_1$ for reducing or cancelling the ARDE effect and thus substantially equalizing the first etch depth $d_1$ of the first portion 100A and the second etch depth $d_2$ of the second portion 100B.

In the metasurface manufacturing method according to some example embodiments, the pattern layer 100 may be etched using the fluorine-based mixed gas G including the first gas G1 and the second gas G2 to thereby form the nanostructure 10 (S103). For example, as the etching method, inductively coupled plasma (ICP) etching, capacitively coupled plasma (CCP) etching, or the like of a plasma dry etching method may be used.

In S103, at least one of sulfur(S), fluorine (F), and fluorocarbon ($CF_x$) may be arranged on the surface of the nanostructure 10, and/or may be injected into the nanostructure 10. The S, F, or $CF_x$ that is arranged on the surface of the nanostructure 10 and/or injected into the nanostructure 10 may be a by-product generated when the pattern layer 100 is etched with the first gas G1 and/or the second gas G2.

Referring to FIGS. 5A to 5C, scanning electron photomicrographs of FIGS. 5A to 5C are photomicrographs showing different regions of a meta-optical device 20 including the nanostructures 10 arranged on the substrate 50. A plurality of pillars 110-1 shown in FIG. 5A are or correspond to pillars formed by etching to have a profile with a cross-sectional width of about 60 nm and a period or pitch of about 300 nm, and a plurality of pillars 110-2 shown in FIG. 5B are pillars formed by etching to have a profile with a cross-sectional width of about 150 nm and a period or pitch of about 300 nm. A plurality of pillars 110-3 shown in FIG. 5C are pillars formed by etching to have a profile with a cross-sectional width of about 230 nm and a period or pitch of about 300 nm. The mixing ratio of the first gas G1 to the second gas G1 may be set such that the plurality of pillars 110-1, 110-2, and 110-3 of FIGS. 5A to 5C, formed in different regions, have substantially the same etch depth. According to FIG. 5A, the nanostructure 10 formed in one region may have an etch depth of about 233 nm, and according to FIG. 5B, the nanostructure 10 formed in another region may have an etch depth of about 250 nm. According to FIG. 5C, the nanostructure 10 formed in another region may have an etch depth of about 250 nm. The etch depth of about 233 nm of a portion of the nanostructure 10 in FIG. 5A may have a difference of about 10% or less (i.e., about 23.3 nm or less) from an etch depth of about 250 nm of another portion of the nanostructure 10, and the etch depth of a portion of the nanostructure 10 in FIG. 5B may be substantially equal to the etch depth of a portion of the nanostructure 10 in FIG. 5C. Referring to FIGS. 5A to 5C, the nanostructure 10 formed according to the metasurface manufacturing method according to some example embodiments may include a plurality of portions that differ in at least one of the diameter and the period of the pillar 110, and the ratio of the second etch depth $d_2$ of the second portion 100B among the plurality of portions to the first etch depth $d_1$ of the first portion 100A among the plurality of portions may be about 0.9 to about 1.1.

An amorphous carbon layer (ACL) may be used as the etching mask 60 when the metasurface of FIGS. 5A to 5C is manufactured. The pillars 110-1, 110-2, and 110-3 may be formed in portions that are not etched during etching using the etching mask 60. The ACL may be removed through a separate process such as a separate cleaning process after the etching.

Figure 6A:
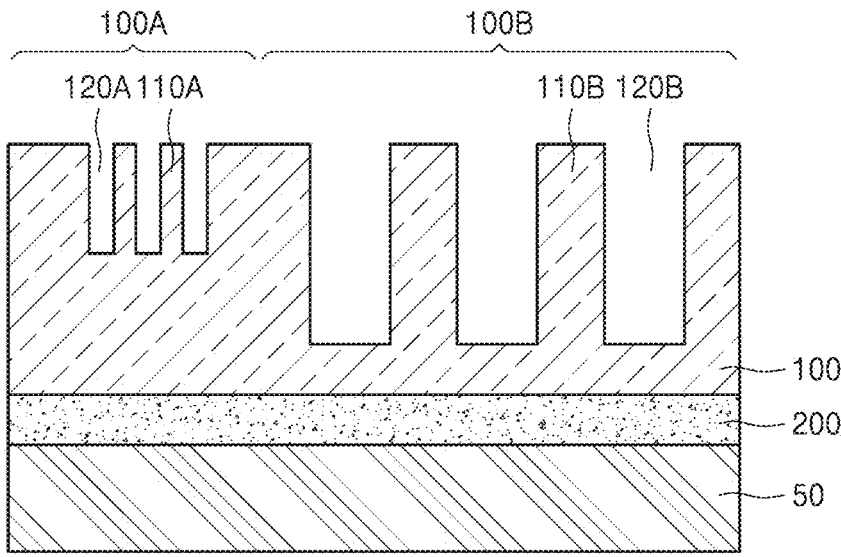
FIG. 6A is a cross-sectional view illustrating a substrate with an etch stop layer further arranged under a pattern layer.
Figure 6B:
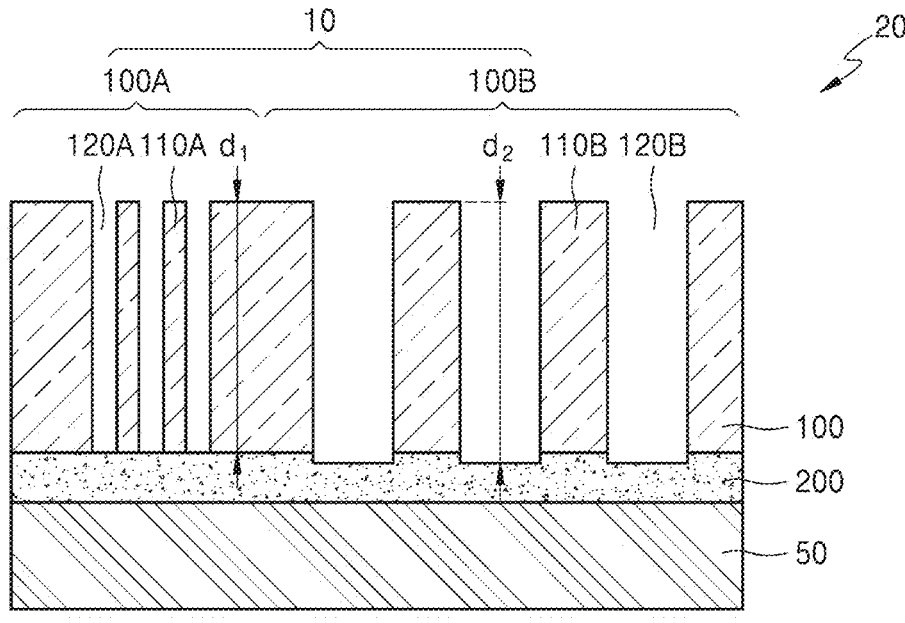
FIG. 6B is a cross-sectional view illustrating a meta-optical device further including an etch stop layer between the substrate and a nanostructure in FIG. 6A.

FIG. 6A is a cross-sectional view illustrating a substrate with an etch stop layer further arranged under a pattern layer, and FIG. 6B is a cross-sectional view illustrating a meta-optical device further including an etch stop layer between the substrate and a nanostructure in FIG. 6A.

An etch stop layer 200 may be arranged between the substrate 50 and the pattern layer 100 of the meta-optical device 20 according to some example embodiments. The substrate 50 used in the metasurface manufacturing method according to some example embodiments may be a substrate further including an etch stop layer 200 under the pattern layer 100. When the pattern layer 100 is etched to form the nanostructure 10, the etch stop layer 200 may be arranged under the pattern layer 100 so that the substrate 50 is not etched. In the etch stop layer 200, an etch rate by the fluorine-based mixed gas G may be low, and the etch rate of the etch stop layer 200 may be lower than or less than the etch rate of the pattern layer 100 and/or the etch rate of the substrate 50. For example, the etch rate of the etch stop layer 200 by the fluorine-based mixed gas G may be less than ⅕ times the etch rate of the pattern layer 100.

When the pattern layer 100 for forming the nanostructure 10 is etched, the etch stop layer 200 may not be etched or may be partially etched. Because the etch rate of the etch stop layer 200 is less than those of the pattern layer 100 and the substrate 50, when the pattern layer 100 is etched to form the nanostructure 10, the substrate 50 may be protected or at least partially protected from being etched, and an ARDE effect generated during etching on different line widths and/or etch areas and/or pitches may be reduced. Accordingly, as the etch stop layer 200 is arranged, the first portion 100A and the second portion 100B of the pillar array included in the pattern layer 100 may have substantially the same etch depth, and/or the first etch depth $d_1$ of the first portion 100A and the second etch depth $d_2$ of the second portion 100B may have a difference within about 10% of the smaller of the first etch depth $d_1$ and the second etch depth $d_2$. For example, the ratio of the second etch depth $d_2$ to the first etch depth $d_1$ may be about 0.9 to about 1.1. The first portion 100A may be a portion of the pillar array, in which a plurality of first pillars 110A having a first diameter and a first period are arranged, and the second portion 100B may be a portion of the pillar array, which is different from the first portion 100A in at least one of the diameter and the period of the pillar 110 and in which a plurality of second pillars 110B having a second diameter and a second period are arranged. As the etch stop layer 200 is arranged, the range of the ratio between the first gas G1 and the second gas G2 included in the fluorine-based mixed gas G for reducing an etch depth difference may be relatively wider than that in the case where the etch stop layer 200 is not arranged.

Alternatively or additionally, the etch stop layer 200 may perform an anti-reflection function. By adjusting the thickness of the etch stop layer 200, reflection occurring on the metasurface may be reduced, and thus, the metasurface including the etch stop layer 200, manufactured by the metasurface manufacturing method according to some example embodiments, may be relatively advantageous when used as an optical device. The anti-reflection function may be implemented through optical interference, and for this, the etch stop layer 200 may have a thickness of ¼ of the wavelength of light. In this case, the wavelength of light may refer to a wavelength of light inside the etch stop layer 200. For example, when the wavelength of incident light is about 500 nm in vacuum and the refractive index of the etch stop layer 200 is n1, the thickness of the etch stop layer 200 may be about 500/(4n1) nm. However, this is merely one of various example embodiments, and the anti-reflection function may be performed in various other ways. For example, the thickness of the etch stop layer 200 may be about 10 nm to about 120 nm.

The etch stop layer 200 may have a refractive index between the refractive index of the substrate 50 and the refractive index of a material included in the pattern layer 100. Alternatively or additionally, light absorption of the etch stop layer 200 may be low due to a low extinction coefficient with respect to light having a wavelength in the visible ray region, for example, light having a wavelength of about 380 nm to about 750 nm. For example, the etch stop layer 200 may have an extinction coefficient of about $1 \times 10^{-5}$ or less in the visible ray region. The etch stop layer 200 may include a dielectric material. For example, the etch stop layer 200 may include aluminum oxide ($Al_2O_3$), hafnium oxide ($HfO_2$), or a compound ($HfAlO_x$) of $Al_2O_3$ and $HfO_2$. In $HfAlO_x$, hafnium (Hf) and aluminum (Al) may constitute a certain ratio, for example, 1:1, 1:2, or 1:3, or other ratios. $HfAlO_x$ thin films having various ratios may be fabricated in precursor and water ($H_2O$) injection process by using trimethylaluminium (MTA, $Al_2(CH_3)_6$) and water ($H_2O$), and/or tetrakis(tetrahydroborate) hafnium ($Hf(BH_4)$ 4) and water ($H_2O$). The etch stop layer 200 is not limited to the above example, and may include SiON, AlON, $Y_2O_3$, $Si_3N_4$, ZnO, $Ta_2O_5$, $ZrO_2$, AlN, $Nb_2O_5$, or a combination (e.g., $AlTaO_x$ or $ZrSiO_x$) of this materials. The etch stop layer 200 may have a refractive index between the refractive index of the substrate 50 and the refractive index of the material of the pattern layer 100 at a wavelength in the visible ray region, and may have an extinction coefficient of about $1 \times 10^{-5}$ or less.

Figure 7:
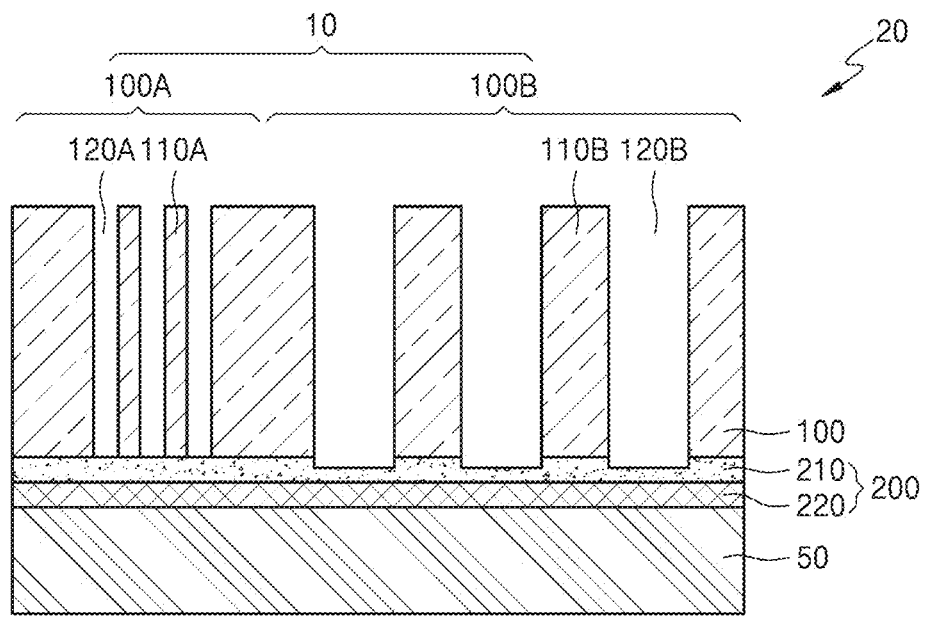
FIG. 7 is a diagram illustrating a meta-optical device including a plurality of etch stop layers between a substrate and a nanostructure.

FIG. 7 is a diagram illustrating a meta-optical device 20 including a plurality of etch stop layers between a substrate and a nanostructure.

The meta-optical device 20 according to some example embodiments may include a plurality of etch stop layers 200. A substrate 50 used in a metasurface manufacturing method according to some example embodiments may be a substrate further including the plurality of etch stop layers 200 under a pattern layer 100. A first etch stop layer 210 may be arranged between the substrate 50 and the pattern layer 100, and a second etch stop layer 220 may be arranged between the substrate 50 and the first etch stop layer 210. The first etch stop layer 210 and the second etch stop layer 220 may include different materials and may or may not include different materials. The refractive index of the first etch stop layer 210 may be greater than or less than that of the second etch stop layer 220. A third etch stop layer (not shown) may be arranged between the substrate 50 and the second etch stop layer 220. The first etch stop layer 210 and the third etch stop layer may be layers including the same material, and thus may have the same refractive index. However, example embodiments are not limited thereto, and the first etch stop layer 210 and the third etch stop layer may include different materials and have different refractive indices. For example, when the first etch stop layer 210 and the third etch stop layer include the same material, the refractive index of the first etch stop layer 210 may be greater than that of the second etch stop layer 220. Each of the plurality of etch stop layers 200 may have a thickness to function as an anti-reflection layer.

Through the metasurface manufacturing method according to some example embodiments, a metasurface including a nanostructure 10 of a pillar array etched to be substantially uniform regardless of etch areas by using a fluorine (F)-based mixed gas and/or an etch stop layer 200 may be formed. Alternatively or additionally, through the metasurface manufacturing method, a metasurface including the nanostructure 10 in which the first etch depth $d_1$ and the second etch depth $d_2$ have a difference of about 10% or less of the smaller of the first etch depth $d_1$ and the second etch depth $d_2$ may be formed. The ratio of the second etch depth $d_2$ to the first etch depth d1 may be about 0.9 to about 1.1. Through the metasurface manufacturing method according to some example embodiments, an ARDE effect that occurs due to different line widths or etch areas may be reduced or cancelled by using a fluorine (F)-based mixed gas and a vertical profile of the nanostructure 10 may be secured, and thus, a metasurface with reduced RIE lag may be provided. A metasurface having a uniform etch depth may have an advantage when implemented as an optical device. In addition, by including the etch stop layer 200, the ARDE effect may be additionally reduced or cancelled, and/or a metasurface manufacturing method with good mass productivity, that reduces or does not cause damage to the metasurface even though an over-etch process is used, may be provided. Alternatively or additionally, the etch stop layer 200 may have an appropriate thickness to perform a function of anti-reflection on the metasurface, thereby reducing the light reflectance of the metasurface.

Figures 8A, 8B:
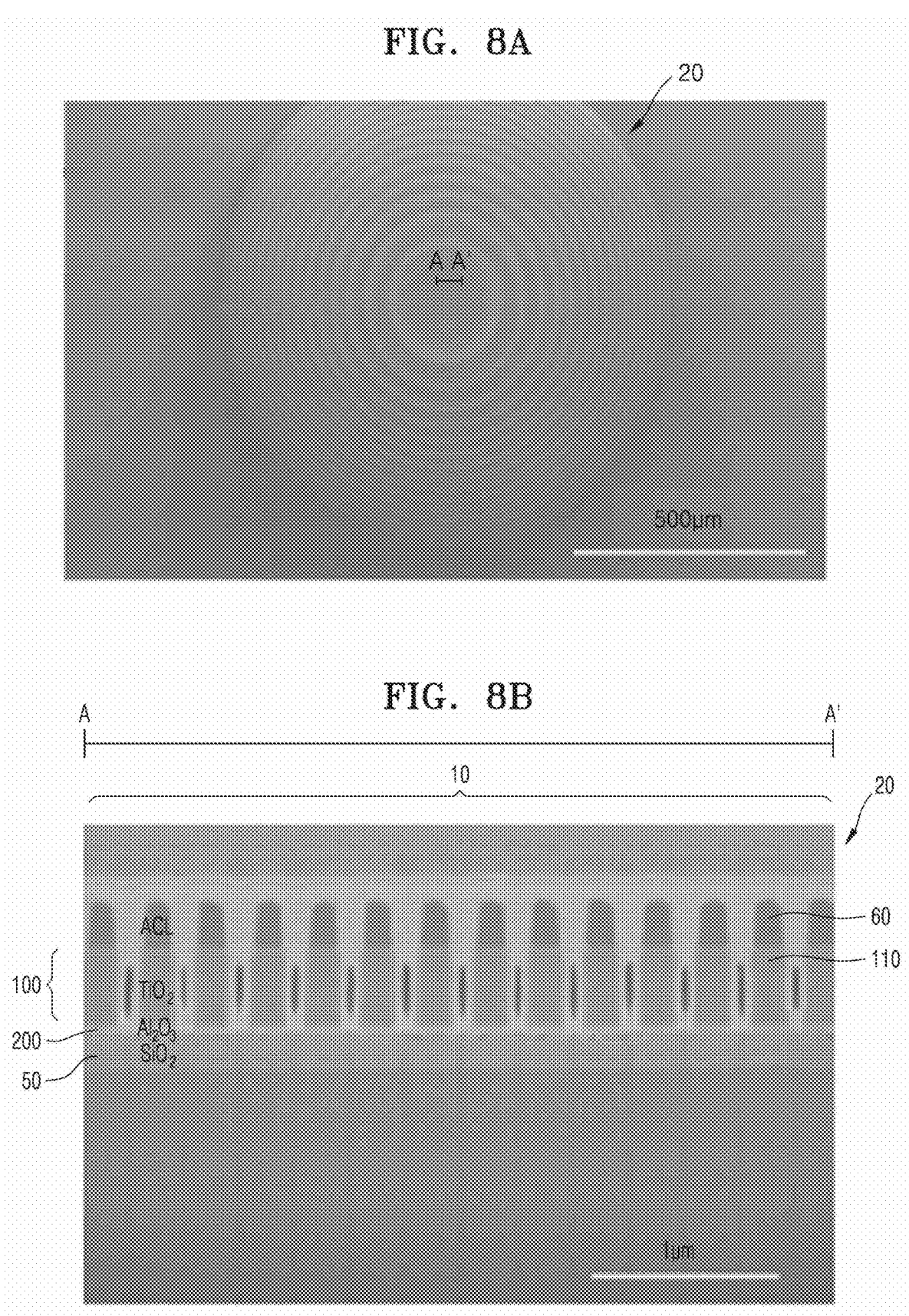
FIG. 8A is a plan view of a meta-optical device according to some example embodiments.
FIG. 8B is a cross-sectional view of the meta-optical device taken along line A-A' of FIG. 8A.
Figure 9A:
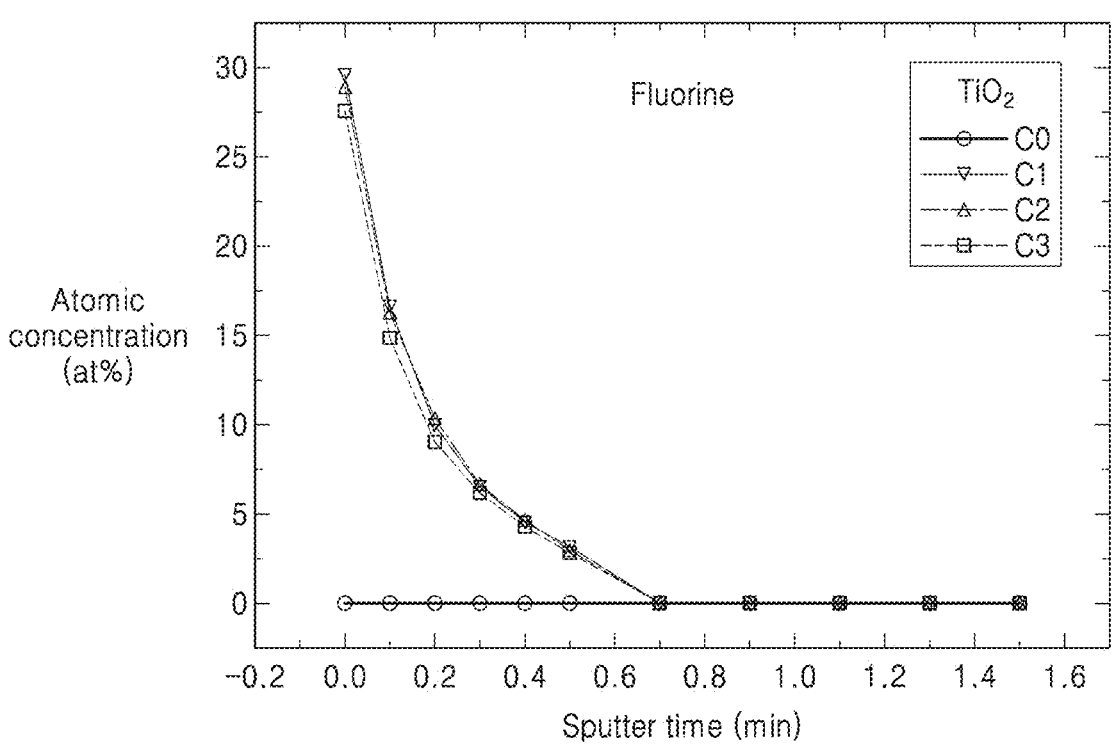
FIG. 9A is a graph showing fluorine (F) atomic concentration according to the depth of a meta-optical device according to some example embodiments.
Figure 9B:
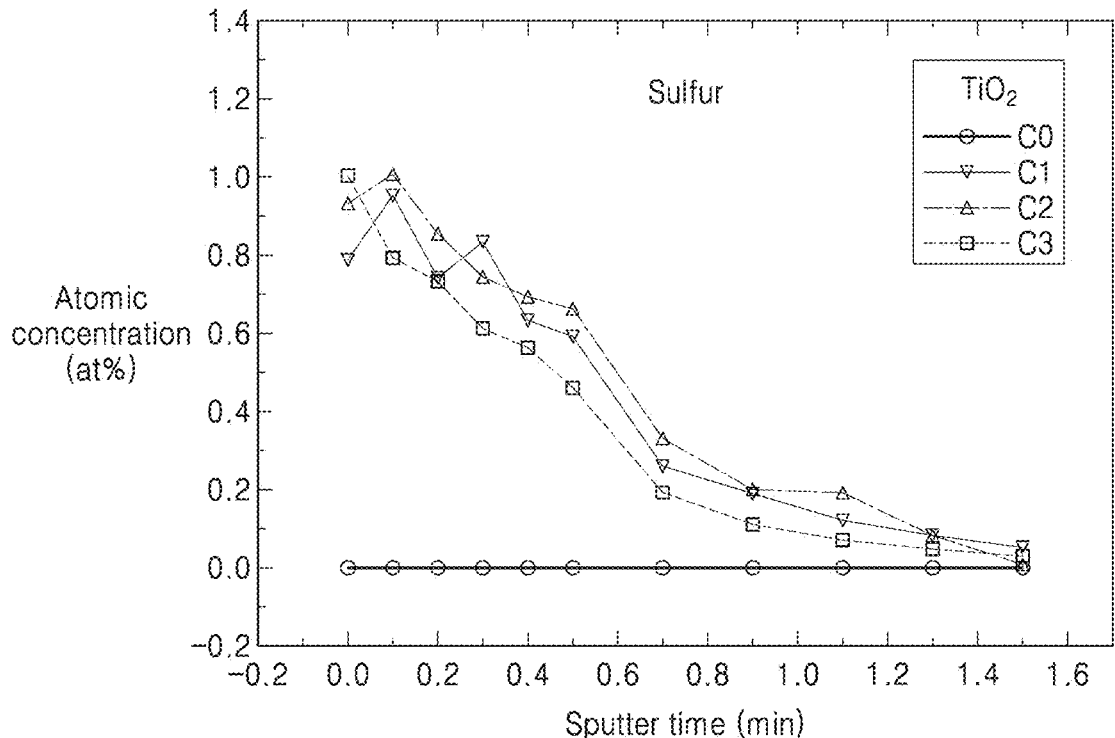
FIG. 9B is a graph showing sulfur (F) atomic concentration according to the depth of a meta-optical device according to some example embodiments.
Figure 9C:
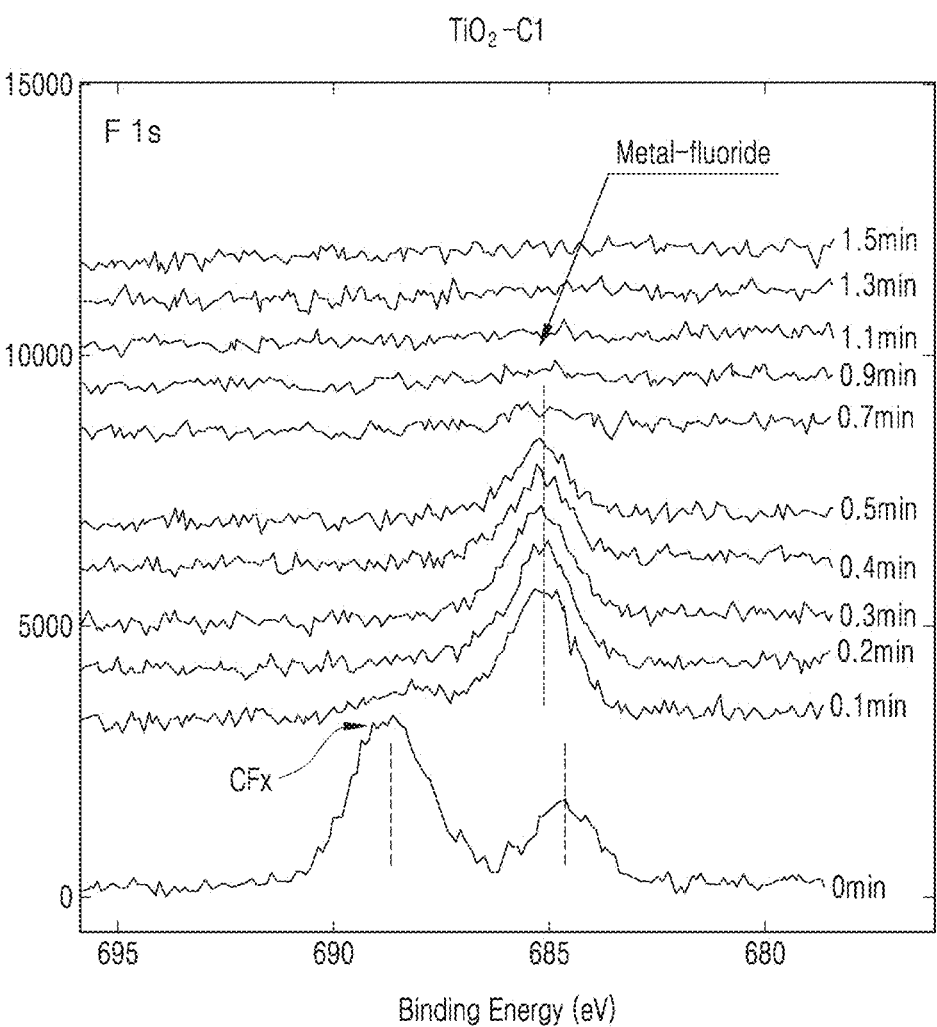
FIGS. 9C to 9E are graphs showing $CF_x$ peaks and metal-fluoride peaks of a meta-optical device according to some example embodiments through X-ray photoelectron spectroscopy (XPS)
Figure 9D:
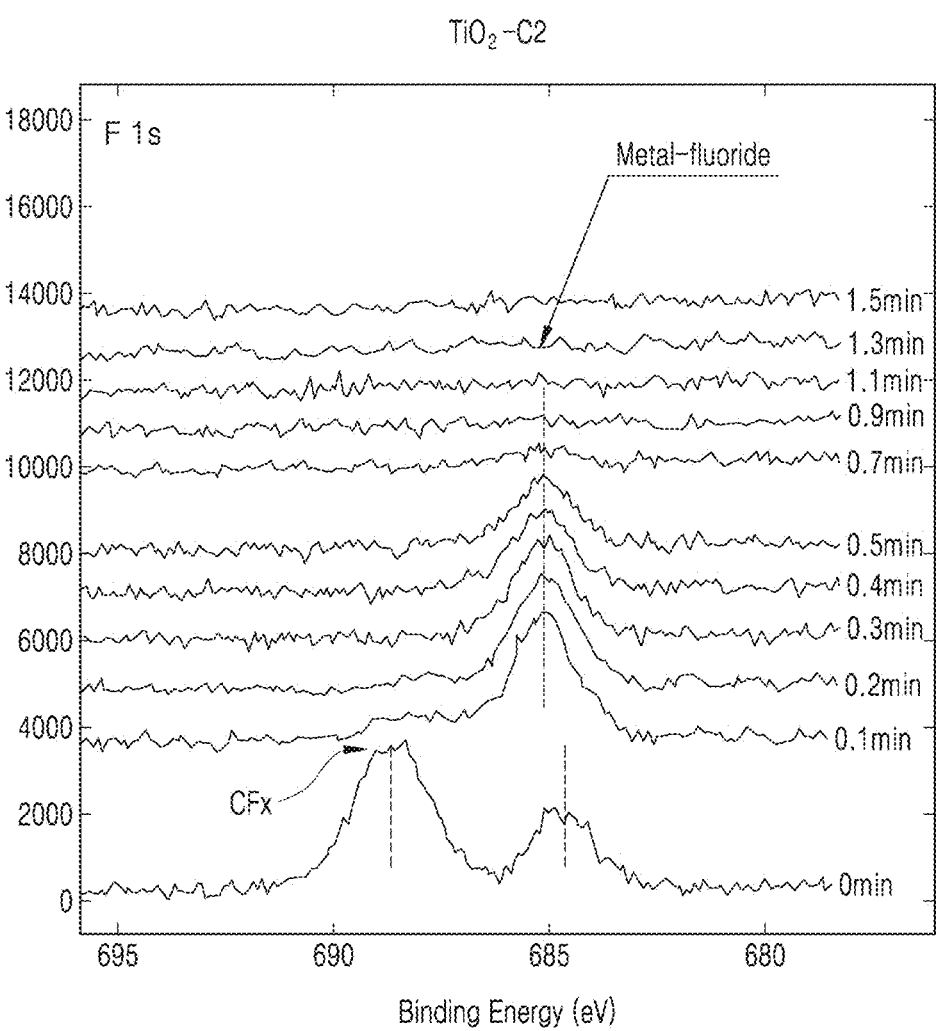
Figure 9E:
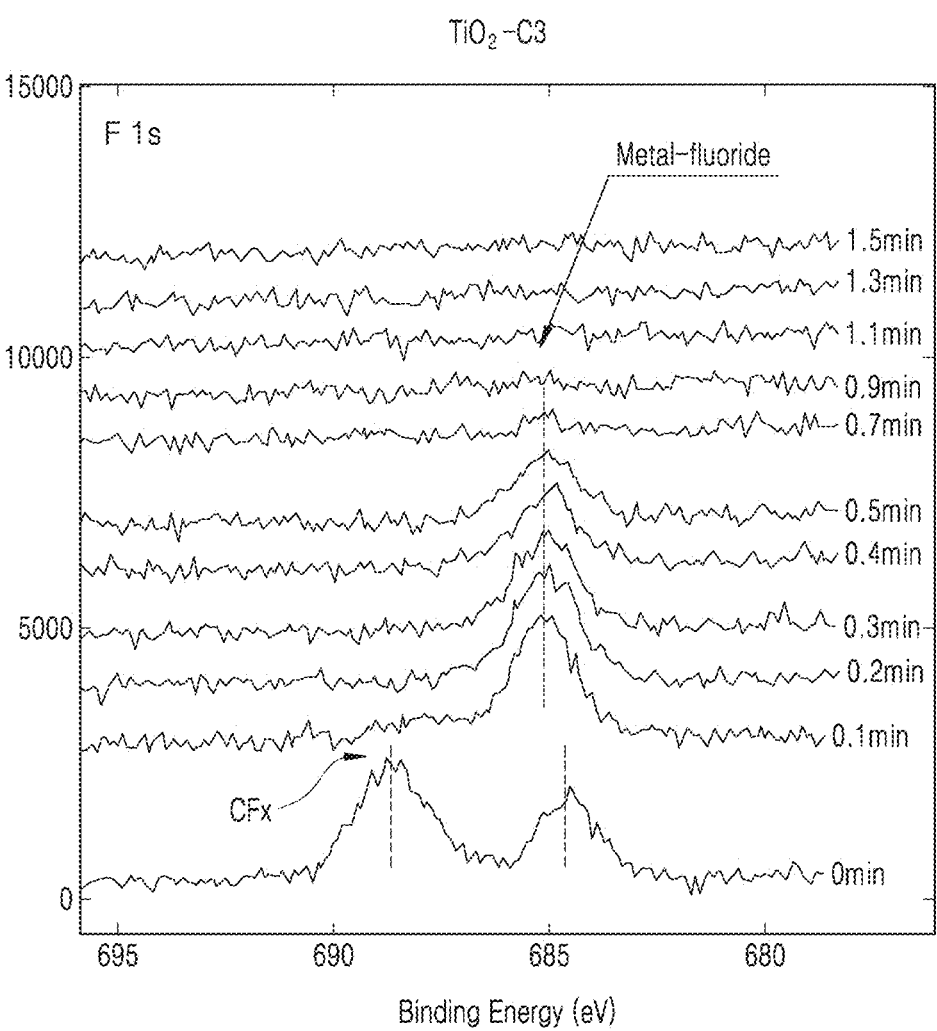

FIG. 8A is an SEM image of a plan view of a meta-optical device according to some example embodiments, and FIG. 8B is an SEM image of a cross-sectional view of the meta-optical device, taken along line A-A' of FIG. 8A. FIG. 9A is a graph showing fluorine (F) atomic concentration according to the depth of a meta-optical device according to some example embodiments, and FIG. 9B is a graph showing sulfur(S) atomic concentration according to the depth of a meta-optical device according to some example embodiments. FIGS. 9C to 9E are graphs showing $CF_x$ peaks and metal-fluoride peaks of a meta-optical device according to some example embodiments through X-ray photoelectron spectroscopy (XPS).

Referring to FIGS. 8A and 8B along with FIGS. 5A-5C, a meta-optical device 20 according to some example embodiments may include a substrate 50 and a nanostructure 10, and as described above, the nanostructure 10 may include a first portion 100A and a second portion 100B, wherein a plurality of first pillars 110A having a first diameter and neighboring along a first period or pitch=are arranged in the first portion 100A, a plurality of second pillars 110B having a second diameter and neighboring a long a second period or pitch are arranged in the second portion 100B, and the second portion 100B is different from the first portion 100A in at least one of the diameter and the period of the pillar 110. The ratio of an etch depth of the second portion 100B of the nanostructure 10 to an etch depth of the first portion 100A of the nanostructure 10 may be about 0.9 to about 1.1, and the nanostructure 10 may include at least one of S, F, and $CF_x$. Alternatively or additionally, at least one of S, F, and $CF_x$ may be deposited on the surface of or injected inside the nanostructure 10 of the meta-optical device 20. The nanostructure 10 may include, for example, $TiO_2$. The meta-optical device 20 according to some example embodiments may include a nanostructure 10 having high refractive index, which includes $TiO_2$ having a higher refractive index than those of existing materials. In addition, the meta-optical device 20 may further include an etch stop layer 200, and thus, even though an over-etch process is used, damage to the substrate 50 and the nanostructure 10 may be reduced or absent. An etching mask 60 in FIG. 8B may be removed through a separate process.

The meta-optical device 20 according to some example embodiments may be or may include an optical device including a metasurface.

The substrate 50 of the meta-optical device 20 according to some example embodiments may include silicon dioxide ($SiO_2$), and the nanostructure 10 may include $TiO_2$. Also, the etch stop layer 200 between the substrate 50 and the nanostructure 10 may include $Al_2O_3$.

A pillar array included in the nanostructure 10 of the meta-optical device 20 according to some example embodiments may include a first portion 100A and a second portion 100B, wherein a plurality of first pillars 110A having a first diameter and a first period are arranged in the first portion 100A, a plurality of second pillars 110B having a second diameter and a second period are arranged in the second portion 100B, and the second portion 100B is different from the first portion 100A in at least one of the diameter and the period or pitch of the pillar 110. For example, the first period or pitch and the second period or pitch may be the same and the first diameter and the second diameter may be different from each other, or, alternatively, the first diameter and the second diameter may be the same and the first period and the second period may be different from each other. Still alternatively, the first diameter and the second diameter may be different from each other and the first period and the second period may be different from each other. For example, the second period may be greater or less than the first period.

The meta-optical device 20 according to some example embodiments may be used as a metasurface optical device including a nanostructure 10 including $TiO_2$, and may be patterned to a thickness of about 2 μm or less on the substrate 50, which is transparent, to thereby form a plane optical device having a thickness of about 1 mm or less, which is a thickness level of the substrate 50. The plane optical device may be used as a lens for a camera and/or for an optical system including a lens, and thus, the thickness and size of the camera itself may be reduced. Alternatively or additionally, the plane optical device may be mounted on a contact image sensor (CIS) to provide a thin image sensor, and may provide a thin image sensor that replaces a lens arranged in a complementary metal-oxide semiconductor (CMOS) image sensor. Alternatively or additionally, the meta-optical device 20 may be included in a light modulator or the like and used as a beam steering device.

The nanostructure 10 of the meta-optical device 20 according to some example embodiments may include at least one of S, F, and $CF_x$. Referring to FIGS. 9A and 9E, the atomic concentrations of F and S according to a sputtering time may be checked, for example with a line scan within a scanning electron microscope. Referring to FIGS. 9C to 9E, a $CF_x$ peak value according to the sputtering time may be known through an XPS analysis method. FIG. 9C shows an XPS analysis result for C1, FIG. 9D shows an XPS analysis result for C2, and FIG. 9E shows an XPS analysis result for C3. In FIGS. 9A to 9E, C0 denotes a portion where there is no contact with the fluorine-based mixed gas G when the nanostructure 10 is formed (e.g., a control), and C1, C2, and C3 denote portions where there is a contact with the fluorine-based mixed gas G when the nanostructure 10 is formed. C1 corresponds to a case in which an ICP etching mode, in which both a source power and a bias power are continuous waves, is used, C2 corresponds to a case in which an ICP etching mode, in which a source power and a bias power are a continuous wave and a pulse wave, respectively, is used, and C3 corresponds to a case in which an ICP etching mode, in which both a source power and a bias power are pulse waves, is used. The atomic concentrations of F and S according to the sputtering time may correspond to the atomic concentrations of F and S according to the depth of the nanostructure 10. For example, F may be located on the surface of and inside the nanostructure 10 by sputtering for about 0.5 minutes (min), and S may be located on the surface of and inside the nanostructure 10 by sputtering for about 1 min. The F content of one cross-section located on the surface of or inside the nanostructure 10 may be about 1 at % to about 50 at %. The S content of one cross-section located on the surface of or inside the nanostructure 10 may be about 0.1 at % to about 5 at %. F and S located on the surface of or inside the nanostructure 10 are by-products generated when the nanostructure 10 is formed using the first gas G1 and the second gas G2. F may be included in the form of $CF_x$ on the surface of the nanostructure 10, and may be included in the form of metal-fluoride in the inside of the nanostructure 10.

In FIGS. 9C to 9E, as peaks of $CF_x$ and metal fluoride appear, it may be determined that $CF_x$ and metal fluoride are included in the nanostructure 10, and because the sputtering time may correspond to the depth of the nanostructure 10, it may be determined that $CF_x$ is included to a certain depth. The $CF_x$ content of one cross-section located on the surface of or inside the nanostructure 10 may be about 1 at % to about 50 at %. $CF_x$ and metal fluoride located on the surface of or inside the nanostructure 10 may be by-products that are generated when the nanostructure 10 is formed using the first gas G1 and the second gas G2. In the nanostructure 10 etched with the fluorine-based mixed gas G, at least one of F, S, and $CF_x$ may include in a formed nanopattern. F may be included in the form of $CF_x$ on the surface of the nanostructure 10, and may be included in the form of metal-fluoride in the inside of the nanostructure 10.

The meta-optical device 20 described above may be applied to various electronic devices. For example, the meta-optical device 20 may be mounted in electronic devices such as a smartphone, a wearable device, an Internet of Things (IoT) device, a home appliance, a tablet personal computer (PC), a personal digital assistant (PDA), a portable multimedia player (PMP), a navigation system, a drone, a robot, an unmanned vehicle, an autonomous vehicle, and an advanced driver assistance system (ADAS).

Figure 10:
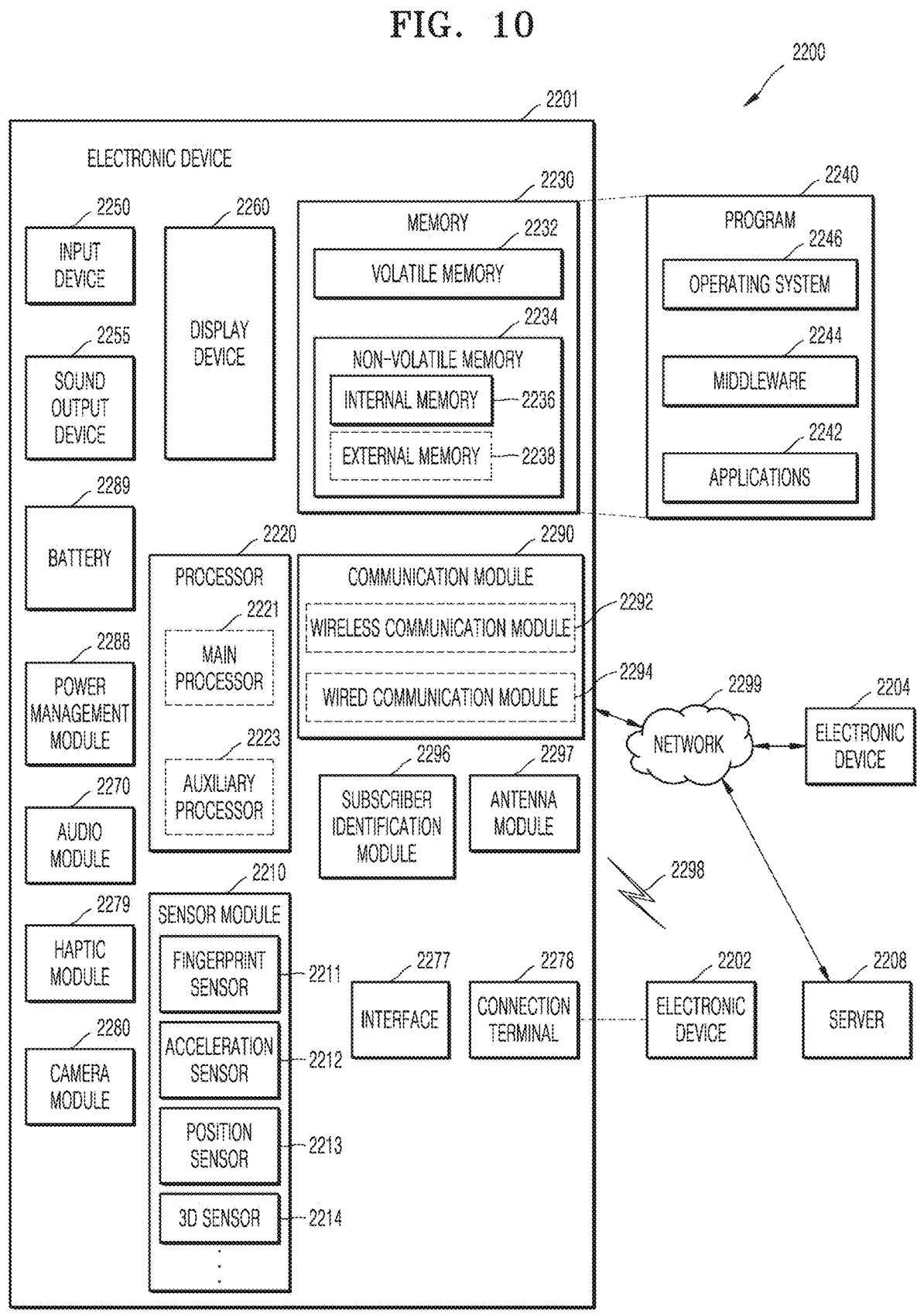
FIG. 10 is a block diagram illustrating a schematic configuration of an electronic device according to an embodiment.

FIG. 10 is a block diagram illustrating a schematic configuration of an electronic device according to an embodiment.

Referring to FIG. 10, in a network environment 2200, an electronic device 2201 may communicate with another electronic device 2202 through a first network 2298 (e.g., a short-range wireless communication network), and/or may communicate with another electronic device 2204 and/or a server 2208 through a second network 2299 (e.g., a long-distance wireless communication network). The electronic device 2201 may communicate with the electronic device 2204 through the server 2208. The electronic device 2201 may include a processor 2220, a memory 2230, an input device 2250, a sound output device 2255, a display device 2260, an audio module 2270, a sensor module 2210, an interface 2277, a haptic module 2279, a camera module 2280, a power management module 2288, a battery 2289, a communication module 2290, a subscriber identification module 2296, and/or an antenna module 2297. In the electronic device 2201, some (e.g., the display device 2260) of these components may be omitted or other components may be added. At least some of these components may be implemented as one integrated circuit. For example, a fingerprint sensor 2211 of the sensor module 2210, an iris sensor, an illuminance sensor, or the like may be implemented by being embedded in the display device 2260 (e.g., a display).

The processor 2220 may execute software (e.g., a program 2240) to control one or more other components (e.g., a hardware component and a software component) of the electronic device 2201 connected to the processor 2220, and may perform various data processing or operations. During data processing and/or data operations, the processor 2220 may load commands and/or data received from other components (e.g., the sensor module 2210 and the communication module 2290) into a volatile memory 2232, process the commands and/or data stored in the volatile memory 2232, and store resulting data in a non-volatile memory 2234. The processor 2220 may include a main processor 2221 (e.g., a central processing unit and/or an application processor) and an auxiliary processor 2223 (e.g., a graphic processing unit, an image signal processor, a sensor hub processor, or a communication processor) that may be operated independently of or in conjunction with the main processor 2221. The auxiliary processor 2223 may use less power than the main processor 2221 and may perform a specialized function.

The auxiliary processor 2223 may control functions and/or states related to some components of the electronic device 2201 (e.g., the display device 2260, the sensor module 2210, and the communication module 2290) with respect to the main processor 2221 while the main processor 2221 is in an inactive state (a sleep state), and/or may operate together with the main processor 2221 while the main processor 2221 is in an active state (an application execution state). The auxiliary processor 2223 (e.g., an image signal processor or a communication processor) may be implemented as a part of another functional component (e.g., the camera module 2280 and/or the communication module 2290).

The memory 2230 may store various data required by components (e.g., the processor 2220 and the sensor module 2276) of the electronic device 2201. The data may include, for example, input data and/or output data for software (e.g., the program 2240) and instructions related thereto. The memory 2230 may include the volatile memory 2232 and/or the non-volatile memory 2234.

The program 2240 may be stored as software in the memory 2230, and may include an operating system 2242, middleware 2244, and/or applications 2246.

The input device 2250 may receive commands and/or data to be used in a component (e.g., the processor 2220) of the electronic device 2201 from the outside (e.g., a user) of the electronic device 2201. The input device 2250 may include one or more of a microphone, a mouse, a keyboard, and/or a digital pen (e.g., a stylus pen).

The sound output device 2255 may output a sound signal to the outside of the electronic device 2201. The sound output device 2255 may include a speaker and/or a receiver. The speaker may be used for general purposes such as multimedia playback or recording playback, and the receiver may be used to receive incoming calls. The receiver may be integrated as a part of the speaker or may be implemented as an independent separate device.

The display device 2260 may visually provide information to the outside of the electronic device 2201. The display device 2260 may include a display, a hologram device, or a projector and a control circuit for controlling the corresponding device. The display device 2260 may include a touch circuitry configured to sense a touch, and/or a sensor circuitry (e.g., a pressure sensor) configured to measure the intensity of force generated by the touch.

The audio module 2270 may convert a sound into an electrical signal or, conversely, convert an electrical signal into a sound. The audio module 2270 may obtain a sound through the input device 2250, and/or output a sound through the sound output device 2255 and/or a speaker and/or headphones of another electronic device (e.g., an electronic device 2102) connected directly or wirelessly to the electronic device 2201.

The sensor module 2210 may detect an operating state (e.g., power and/or temperature) of the electronic device 2201, and/or may detect an external environmental state (e.g., a user state) and generate an electrical signal and/or data value corresponding to a sensed state. The sensor module 2210 may include a fingerprint sensor 2211, an acceleration sensor 2212, a position sensor 2213, a three-dimensional (3D) sensor 2214, and the like. In addition, the sensor module 2210 may include an iris sensor, a gyro sensor, a barometric pressure sensor, a magnetic sensor, a grip sensor, a proximity sensor, a color sensor, an infrared (IR) sensor, a biometric sensor, a temperature sensor, a humidity sensor, and/or an illuminance sensor.

The 3D sensor 2214 may irradiate certain light to an object and analyze light reflected from the object to sense the shape and movement of the object. The 3D sensor 2214 may include any one of the meta-optical devices 20 described with reference to FIGS. 1 to 9E.

The interface 2277 may support one or more designated protocols that may be used to connect the electronic device 2201 directly and/or wirelessly with another electronic device (e.g., the electronic device 2102). The interface 2277 may include one or more of a high definition multimedia interface (HDMI), a universal serial bus (USB) interface, a secure digital (SD) card interface, and/or an audio interface.

A connection terminal 2278 may include a connector through which the electronic device 2201 may be physically connected to another electronic device (e.g., the electronic device 2202). The connection terminal 2278 may include one or more of an HDMI connector, a USB connector, an SD card connector, and/or an audio connector (e.g., a headphone connector).

The haptic module 2279 may convert an electrical signal into a mechanical stimulus (e.g., vibration or movement) or an electrical stimulus that a user may perceive through tactile or kinesthetic sense. The haptic module 2279 may include a motor, a piezoelectric element, and/or an electrical stimulation device.

The camera module 2280 may capture still images and moving images. The camera module 2280 may include a lens assembly including one or more lenses, image sensors, image signal processors, and/or flashes. The lens assembly included in the camera module 2280 may collect light emitted from a subject, which is a target of image capturing, and any one of the meta-optical devices 20 described with reference to FIGS. 1 to 9E may be included in the lens assembly.

The power management module 2288 may manage power supplied to the electronic device 2201. The power management module 2288 may be implemented as a part of a power management integrated circuit (PMIC).

The battery 2289 may supply power to components of the electronic device 2201. The battery 2289 may include one or more of a non-rechargeable primary cell, a rechargeable secondary cell, and/or a fuel cell.

The communication module 2290 may support the establishment of a direct (wired) communication channel and/or wireless communication channel between the electronic device 2201 and other electronic devices (e.g., the electronic device 2202, the electronic device 2204, and the server 2208), and may support performing communication through an established communication channel. The communication module 2290 may include one or more communication processors that operate independently of the processor 2220 (e.g., an application processor) and support direct communication and/or wireless communication. The communication module 2290 may include a wireless communication module 2292 (e.g., one or more of a cellular communication module, a short-range wireless communication module, or a global navigation satellite system (GNSS) communication module) and/or a wired communication module 2294 (e.g., a local area network (LAN) communication module and/or a power line communication module). Among these communication modules, a corresponding communication module may communicate with other electronic devices through the first network 2298 (e.g., a short-range communication network such as one or more of Bluetooth, WiFi Direct, or infrared data association (IrDA)) or the second network 2299 (e.g., a long-distance communication network such as one or more of a cellular network, the Internet, or a computer network (e.g., LAN or WAN)). These various types of communication modules may be integrated into one component (e.g., a single chip) or implemented as a plurality of components (e.g., a plurality of chips) separate from each other. The wireless communication module 2292 may identify and/or authenticate the electronic device 2201 within a communication network such as the first network 2298 and/or the second network 2299 by using subscriber information (e.g., an international mobile subscriber identifier (IMSI)) stored in the subscriber identification module 2296.

The antenna module 2297 may transmit or receive signals and/or power to the outside (e.g., other electronic devices). An antenna may include a radiator including a conductive pattern formed on a substrate (e.g., a printed circuit board (PCB)). The antenna module 2297 may include one or a plurality of antennas. When a plurality of antennas are included in the antenna module 2297, an antenna suitable for a communication method used in a communication network such as the first network 2298 and/or the second network 2299 may be selected from among the plurality of antennas by the communication module 2290. Signals and/or power may be transmitted or received between the communication module 2290 and another electronic device through the selected antenna. In addition to the antenna, other components (e.g., a radio frequency integrated circuit (RFIC)) may be included as a part of the antenna module 2297.

Some of the components may be connected to each other through a communication scheme (e.g., one or more of a bus, a general purpose input and output (GPIO), a serial peripheral interface (SPI), or a mobile industry processor interface (MIPI)) between peripheral devices and exchange signals (e.g., commands and data).

A command or data may be transmitted or received between the electronic device 2201 and the electronic device 2204, which is an external device, through the server 2208 connected to the second network 2299. The electronic devices 2202 and 2204 may be of the same type as the electronic device 2201 or a different type from the electronic device 2201. All or some of the operations performed in the electronic device 2201 may be performed in one or more of other electronic devices, for example, the electronic devices 2202 and 2204 and the server 2208. For example, when the electronic device 2201 needs to perform a function or service, the electronic device 2201 may request one or more other electronic devices to perform a part of the function or service or the entire function or service instead of performing the function or service by itself. One or more other electronic devices receiving the request may perform an additional function or service related to the request and transmit a result of the performing to the electronic device 2201. To this end, at least one of cloud computing, distributed computing, and/or client-server computing technologies may be used.

Figure 11:
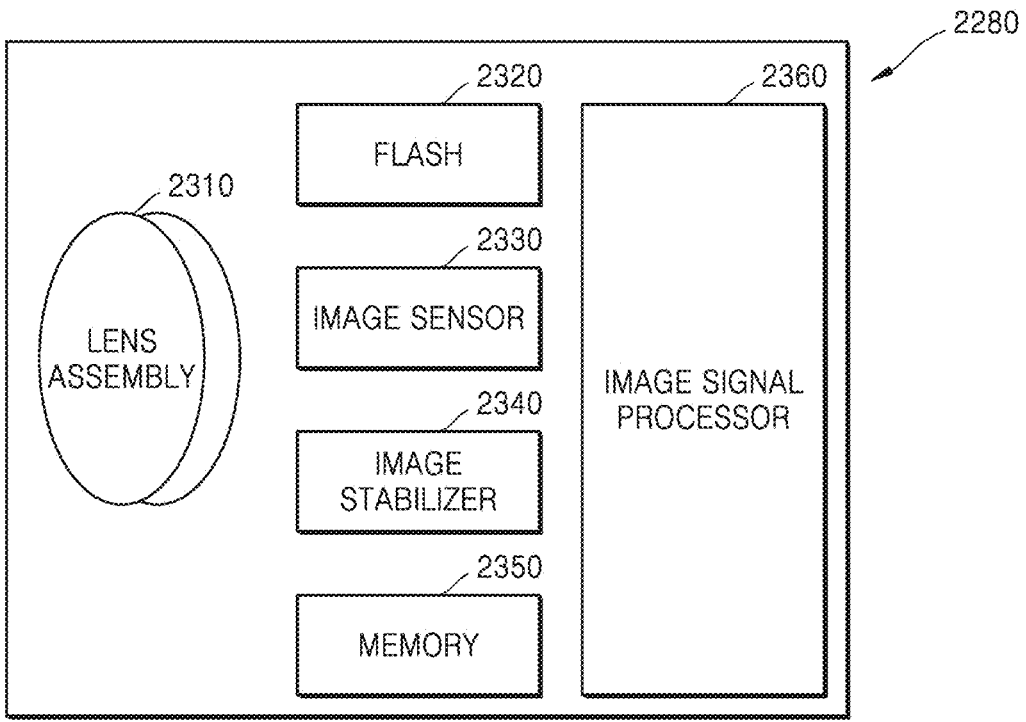
FIG. 11 is a block diagram illustrating a schematic configuration of a camera module included in the electronic device of FIG. 10.

FIG. 11 is a block diagram illustrating a schematic configuration of a camera module included in the electronic device 2201 of FIG. 10.

Referring to FIG. 11, the camera module 2280 may include a lens assembly 2310, a flash 2320, an image sensor 2330, an image stabilizer 2340, a memory 2350 (e.g., a buffer memory), and/or an image signal processor 2360. The lens assembly 2310 may collect light emitted from a subject, which is an image capturing target, and may include any one or more of the meta-optical devices 20 described with reference to FIGS. 1 to 9E. The lens assembly 2310 may include one or more refractive lenses and an optical device. The optical device provided therein may be designed as a lens having a target phase delay profile that exhibits constant light collection efficiency over a wide wavelength band. The lens assembly 2310 including such an optical device may realize desired optical performance and have a short optical length.

The camera module 2280 may further include an actuator. For example, the actuator may drive lens elements constituting the lens assembly 2310 to adjust positions thereof and a separation distance between the lens elements during a zooming and/or autofocus (AF).

The camera module 2280 may include a plurality of lens assemblies 2310. In this case, the camera module 2280 may be a dual camera, a 360 degree camera, or a spherical camera. At least some of the plurality of lens assemblies 2310 may have the same lens property (e.g., an angle of view, a focal length, an auto focus, an F number, and an optical zoom) or may have different lens properties. The lens assembly 2310 may include a wide-angle lens or a telephoto lens.

The flash 2320 may emit light used to enhance light emitted or reflected from the subject. The flash 2320 may include one or more light-emitting diodes (LEDs) (e.g., a red-green-blue (RGB) LED, a white LED, an infrared LED, and an ultraviolet LED), and/or a xenon lamp.

The image sensor 2330 may be an image sensor including the meta-optical devices 20 described with reference to FIGS. 1 to 9E, and may convert light emitted or reflected from the subject and transmitted through the lens assembly 2310 into an electrical signal, thereby acquiring an image corresponding to the subject. The image sensor 2330 may include one or a plurality of sensors selected from among image sensors having different properties, such as an RGB sensor, a black and white (BW) sensor, an infrared ray (IR) sensor, and an ultraviolet ray (UV) sensor. Each of the sensors included in the image sensor 2330 may be implemented as a charge-coupled device (CCD) sensor and/or a complementary metal oxide semiconductor (CMOS) sensor.

In response to the movement of the camera module 2280 and/or the electronic device 2201 including the camera module 2280, the image stabilizer 2340 may move one or a plurality of lenses, included in the lens assembly 2310, and/or the image sensor 2330 in a certain direction or control (e.g., adjusting a read-out timing) the operating characteristics of the image sensor 2330 to thereby compensate for a negative effect of the movement. The image stabilizer 2340 may detect the movement of the camera module 2280 or the electronic device 2201 by using a gyro sensor (not shown) or an acceleration sensor (not shown) arranged inside or outside the camera module 2280. The image stabilizer 2340 may be implemented in an optical manner.

The memory 2350 may store some or all data of an image acquired through the image sensor 2330 for the purpose of a subsequent image processing operation. For example, when a plurality of images are acquired at high speed, acquired original data (e.g., Bayer-patterned data or high-resolution data) may be stored in the memory 2350, and only a low-resolution image may be displayed and then be used to cause original data of a selected image (e.g., an image selected by a user) to be transmitted to the image signal processor 2360. The memory 2350 may be integrated into the memory 2230 of the electronic device 2201 or may be configured as a separate memory operated independently.

The image signal processor 2360 may perform one or more image processing on an image acquired through the image sensor 2330 or image data stored in the memory 2350. One or more image processing may include depth map generation, 3D modeling, panorama generation, feature point extraction, image synthesis, and/or image compensation (e.g., one or more of noise reduction, resolution adjustment, brightness adjustment, blurring, sharpening, or softening). The image signal processor 2360 may perform control (e.g., exposure time control or readout timing control) on components (e.g., the image sensor 2330) included in the camera module 2280. An image processed by the image signal processor 2360 may be stored back in the memory 2350 for the purpose of further processing or provided to external components (e.g., one or more of the memory 2230, the display device 2260, the electronic device 2202, the electronic device 2204, and the server 2208) of the camera module 2280. The image signal processor 2360 may be integrated into the processor 2220 or configured as a separate processor operated independently of the processor 2220. When the image signal processor 2360 is configured as a separate processor operated independently of the processor 2220, an image processed by the image signal processor 2360 may be subjected to additional image processing by the processor 2220 and then displayed on the display device 2260.

The electronic device 2201 may include a plurality of camera modules 2280 having different properties or functions. In this case, one of the plurality of camera modules 2280 may be a wide-angle camera, and the other may be a telephoto camera. Similarly, one of the plurality of camera modules 2280 may be a front camera and the other may be a rear camera.

Figure 12:
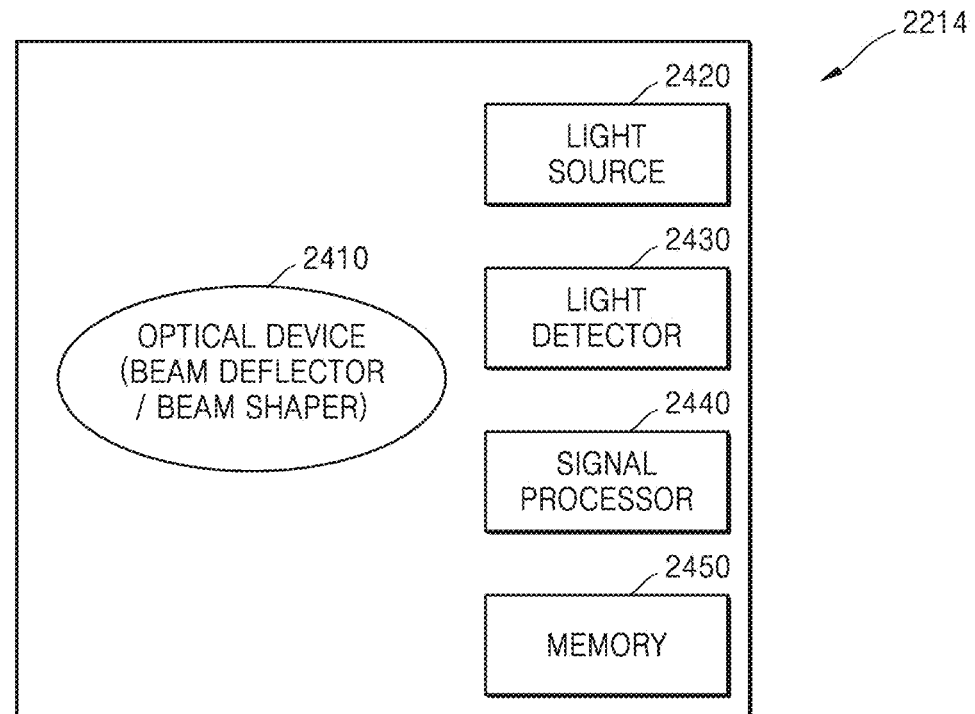
FIG. 12 is a block diagram illustrating a schematic configuration of a three-dimensional (3D) sensor provided in the electronic device of FIG. 11.

FIG. 12 is a block diagram illustrating a schematic configuration of a 3D sensor 2214 provided in the electronic device 2201 of FIG. 11.

The 3D sensor 2214 senses the shape, movement, etc. of an object by irradiating certain light to the object and receiving and analyzing the light reflected from the object. The 3D sensor 2214 includes a light source 2420, an optical device 2410, a light detector 2430, a signal processor 2440, and a memory 2450. As the optical device 2410, any one or more of the meta-optical devices 20 described with reference to FIGS. 1 to 9E may be employed, and a target phase delay profile may be set to function as a beam deflector or a beam shaper.

The light source 2420 irradiates light to be used to analyze the shape or position of the object. The light source 2420 may include a light source that generates and irradiates light having a small wavelength. The light source 2420 may include a light source such as one or more of a laser diode (LD), light-emitting diode (LED), or super luminescent diode (SLD) that generates and irradiates light of a wavelength band suitable for analyzing the position and shape of the object, for example, light of an infrared band wavelength. The light source 2420 may be a tunable laser diode. The light source 2420 may generate and irradiate light of a plurality of different wavelength bands. The light source 2420 may generate and irradiate pulsed light or continuous light.

The optical device 2410 modulates the light irradiated from the light source 2420 and transmits the modulated light to the object. When the optical device 2410 is or includes a beam deflector, the optical device 2410 may deflect incident light in a certain direction to be directed toward the object. When the optical device 2410 is or includes a beam shaper, the optical device 2410 modulates incident light so that the incident light has a distribution having a certain pattern. The optical device 2410 may form structured light suitable for 3D shape analysis.

As described above, the optical device 2410 may exhibit constant or near constant diffraction efficiency with respect to a broadband wavelength. Accordingly, it is possible to perform beam steering with improved accuracy and/or to form a desired beam pattern without deviation according to wavelength.

The light detector 2430 receives reflected light of light irradiated to the object via the optical device 2410. The light detector 2430 may include an array of a plurality of sensors that sense light, or may include only one sensor.

The signal processor 2440 may process a signal sensed by the light detector 2430 and analyze the shape of the object. The signal processor 2440 may analyze a 3D shape including the depth position of the object.

For the 3D shape analysis, an operation for measuring a time of flight of light may be performed. Various arithmetic operation methods may be used to measure the time of flight of light. For example, in a direct time measurement method, a distance is obtained by projecting pulsed light onto an object and measuring, with a timer, a time for the light to return after being reflected by the object. In a correlation method, a pulsed light is projected onto an object and a distance is measured from the brightness of reflected light reflected from the object. A phase delay measurement method is a method of projecting continuous wave light, such as a sine wave, onto an object, detecting a phase difference of reflected light reflected from the object, and converting the detected phase difference into a distance.

When structured light is incident on the object, the depth position of the object may be calculated from a change in a pattern of the structured light reflected from the object, for example, a result of comparison with a pattern of the incident structured light. Depth information of the object may be extracted by tracking a pattern change for each coordinate of the structured light reflected from the object, and 3D information related to the shape and movement of the object may be extracted from the depth information.

The memory 2450 may store programs and data necessary for the operation of the signal processor 2440.

An operation result of the signal processor 2440, for example, information on the shape and position of the object, may be transmitted to another unit in the electronic device 2201 or to another electronic device. For example, the information may be used by the application 2246 stored in the memory 2230. The other electronic device to which the operation result is transmitted may be a display device or a printer that outputs the operation result. In addition, the other electronic device may be an autonomous driving device, such as an unmanned vehicle, an autonomous vehicle, a robot, or a drone, a smart phone, a smart watch, a mobile phone, a PDA, a laptop, a PC, a wearable device, a mobile or non-mobile computing device, or an IoT device.

The meta-optical device according to some example embodiments may provide a meta-optical device substantially and uniformly etched regardless of an etch area.

The meta-optical device according to some example embodiments may include a first portion and a second portion which differ in at least one of the period and the diameter of pillars, wherein a ratio of an etch depth of the second portion to an etch depth of the first portion may be about 0.9 to about 1.1.

An etch stop layer included in the meta-optical device according to some example embodiments may have a certain thickness to function as an anti-reflection layer.

The meta-optical device according to some example embodiments may provide a meta-optical device having a refractive index of about 2.45 in a visible ray region and an extinction coefficient of about 10-5 or less.

The meta-optical device according to some example embodiments, which is a metasurface optical device including a $TiO_2$ pillar array, may be patterned on a substrate to a thickness of about 2 μm or less to thereby provide a thin meta-optical device having a thickness of about 1 mm or less.

Through the metasurface manufacturing method according to some example embodiments, a metasurface including a $TiO_2$ pillar array etched to be substantially uniform regardless of an etch area by using a fluorine (F)-based mixed gas and/or an etch stop layer may be manufactured.

According to the metasurface manufacturing method of some example embodiments, a metasurface including a $TiO_2$ pillar array with a small difference in an etch depth according to an etch area may be manufactured by using a fluorine (F)-based mixed gas and/or an etch stop layer.

The metasurface manufacturing method according to some example embodiments may compensate for an ARDE phenomenon, which occurs when a TiO2 layer is etched, by using a fluorine (F)-based mixed gas and/or an etch stop layer.

Figure 13A:
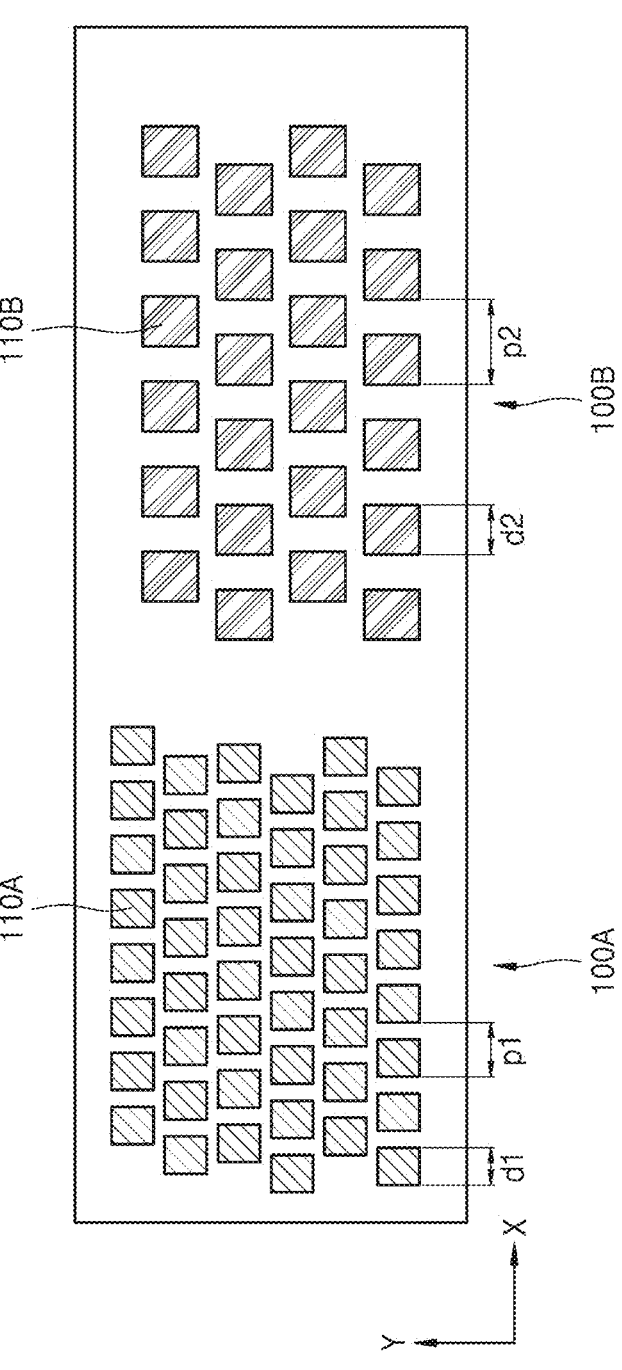
FIGS. 13A and 13B are plan views of meta-optical devices, according to some example embodiments.
Figure 13B:
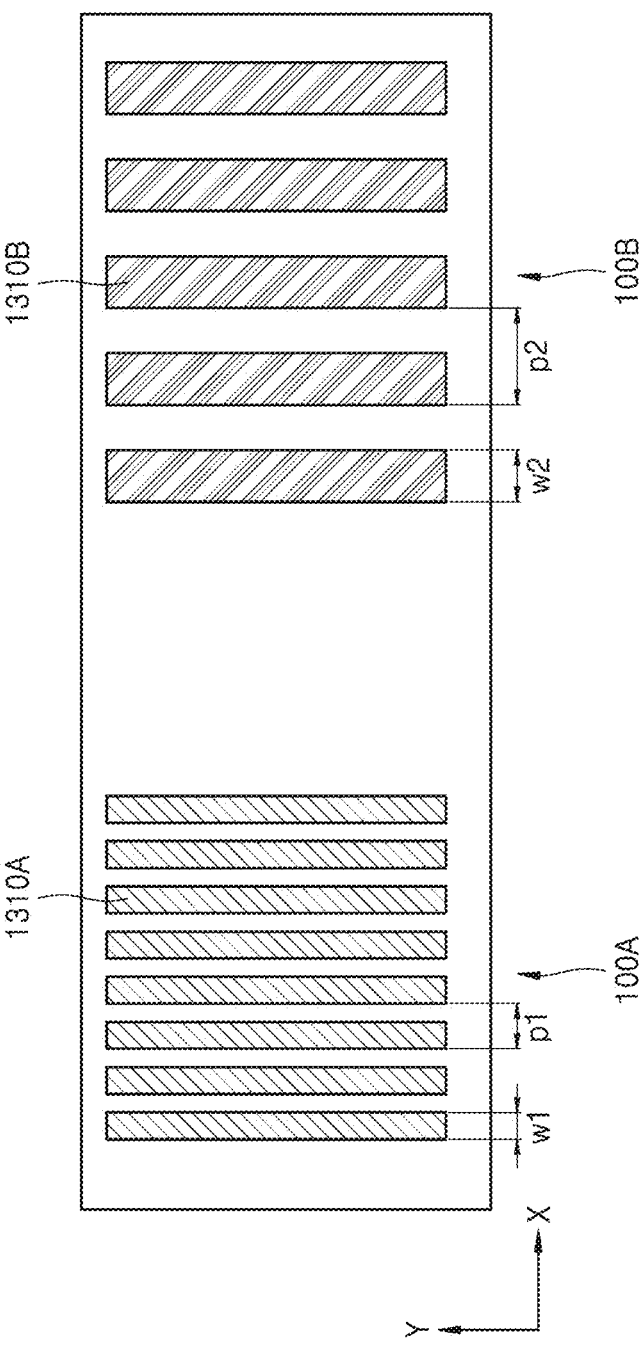

FIGS. 13A-13B are plan views of meta-optical devices, according to some example embodiments.

Referring to FIG. 13A, a meta-optical device may include a first region 100A having a plurality of first pillars 110A arranged in a lattice that extends in a first direction X and a second direction Y. Each of the first pillars 110A may have a shape, for example a polygonal shape such as a square shape, and/or may have another shape such as an oval shape such as a circular shape, with a greatest distance d1. The first pillars 110A may be arranged to neighbor others in the first direction X at a certain first pitch p1.

The meta-optical device may include a second region 100B having a plurality of second pillars 110B arranged in a lattice that extends in the first direction X and the second direction Y. Each of the second pillars 110B may have a shape, for example a polygonal shape such as a square shape, and/or may have another shape such as an oval shape such as a circular shape, with a greatest distance d2. The second pillars 110B may be arranged to neighbor others in the first direction X at a certain second pitch p2.

A depth of the first pillars 110A may be within 10% of a depth of the second pillars 110B.

Referring to FIG. 13B, a meta-optical device may include a first region 100A having a diffraction grating including a plurality of first lines 1310A arranged in a first direction X and extending in a second direction Y. Each of the first lines 1310A may have a first width w1. The first lines 1310A may be arranged to neighbor others in the first direction X at a certain first pitch p1.

The meta-optical device may include a second region 100B having a diffraction grating including a plurality of second lines 1310B arranged in a first direction X and extending in a second direction Y. Each of the second lines 1310B may have a second width w2. The second lines 1310B may be arranged to neighbor others in the first direction X at a certain second pitch p2

A depth of the first lines 1310A may be within 10% of a depth of the second lines 1310B.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

Furthermore any of the elements and/or functional blocks disclosed above may be connected to any other ones of the elements and/or functional blocks disclosed above. For example, there may be a one-way or a two-way communication between one element or functional block, and another element or functional block. One element or functional block may be able to send and/or receive data and/or commands to any another element and/or functional block, through one or more buses such as one or more wired communication bus and/or one or more wireless communication bus.

It should be understood that various example embodiments described herein should be considered in a descriptive sense only and not for purposes of limitation. Descriptions of features and/or aspects within each variously described embodiment should typically be considered as available for other similar features or aspects in other example embodiments, and example embodiments are not necessarily mutually exclusive with one another. While one or more example embodiments have been described with reference to the figures, it will be understood by those of ordinary skill in the art that various changes in form and details may be made therein without departing from the spirit and scope as defined by the following claims.

What is claimed is:

1. A meta-optical device comprising:
   a substrate;
   a nanostructure, the nanostructure including at least one of a pillar array or defining a hole array, the pillar array or the hole array arranged on the substrate; and
   a first etch stop layer between the substrate and the nanostructure, wherein the nanostructure includes a first portion and a second portion, a plurality of first pillars having a first diameter and neighboring at a first pitch are arranged in the first portion, a plurality of second pillars having a second diameter and neighboring at a second pitch are arranged in the second portion, the second portion is different from the first portion in at least one of a diameter and a pitch, and a ratio of an etch depth of the second portion to an etch depth of the first portion is about 0.9 to about 1.1, and at least one of sulfur(S), fluorine (F), and fluorocarbon $(CF_x)$ is at least one of on a surface of or inside the nanostructure, wherein a content of S in at least one of a cross-section of the surface or inside the nanostructure is about 0.1 at % to about 5 at %, and wherein an etch rate of the first etch stop layer with respect to etching with a fluorine-based mixed gas including sulfur hexafluoride $(SF_6)$ and octafluorocy-clobutene $(C_4H_8)$ is less than $\frac{1}{5}$ times an etch rate of a material included in the nanostructure.

2. The meta-optical device of claim 1, wherein a content of F in the at least one of the cross-section of the surface or inside the nanostructure is about 1 at % to about 50 at %.

3. The meta-optical device of claim 1, wherein the meta-optical device has a thickness of about 1 mm or less.

4. The meta-optical device of claim 1, wherein the first pitch of the nanostructure is about 150 nm to about 500 nm, one of first widths or second widths of a cross-section of one of the plurality of first pillars and the plurality of second pillars in the nanostructure is about 50 nm to about 350 nm, a height of the one of the plurality of first pillars and the plurality of second pillars in the nanostructure is about 200 nm to about 2000 nm, and an aspect ratio of the one of the plurality of first pillars and the plurality of second pillars in the nanostructure is about 1:5 or more.

5. The meta-optical device of claim 1, wherein the material of the nanostructure has a refractive index of about 2 or more and an extinction coefficient of about $1\times10^{-5}$ or less in a visible ray region.

6. The meta-optical device of claim 1, wherein the nanostructure includes $TiO_2$.

7. The meta-optical device of claim 1, wherein an extinction coefficient of the first etch stop layer in a visible ray region is about $1\times10^{-5}$ or less, a refractive index of the first etch stop layer is between a refractive index of a material arranged on the first etch stop layer and a refractive index of a material arranged under the first etch stop layer, and the first etch stop layer has a thickness that reduces light reflection in the visible ray region, the light reflection occurring in a metasurface.

8. The meta-optical device of claim 7, wherein the thickness of the first etch stop layer is about 10 nm to about 120 nm, and the first etch stop layer includes at least one of $Al_2O_3$, $HfO_2$, SiON, AlON, $Y_2O_3$, $Si_3N_4$, ZnO, $Ta_2O_5$, $ZrO_2$, AlN, and $Nb_2O_5$.

9. The meta-optical device of claim 1, further comprising:

a material between the first etch stop layer and the nanostructure, the material between the first etch stop layer and the nanostructure being different from a material of the first etch stop layer.

10. An electronic device comprising the meta-optical device according to claim 1.

11. The electronic device of claim 10, further comprising:

an image sensor;

an image signal processor connected to the image sensor; and a camera module configured to capture still images and moving images based on the image sensor.

12. The electronic device of claim 11, wherein the camera module includes a lens assembly configured to collect light emitted from a subject, and the meta-optical device is included in the lens assembly.

13. The electronic device of claim 12, wherein the camera module further includes an actuator configured to drive lens elements of the lens assembly.

14. The electronic device of claim 13, wherein the camera module further includes an image stabilizer configured to detect movement of the camera module or the electronic device.

15. The electronic device of claim 14, wherein the image stabilizer includes at least one of a gyro sensor or an acceleration sensor.

16. The electronic device of claim 12, wherein the camera module further includes a flash including a light-emitting diode configured to enhance at least one of the light emitted or the light reflected from the subject.

17. The electronic device of claim 16, wherein the camera module further includes a memory configured to store data of an image acquired through the image sensor.

\* \* \* \* \*